US012672265B2

(12) United States Patent (10) Patent No.: US 12,672,265 B2
Matsuoka (45) Date of Patent: Jun. 30, 2026

(54) ELECTRONIC DEVICE

(71) Applicant: DENSO CORPORATION, Kariya City (JP)

(72) Inventor: Kimihiro Matsuoka, Kariya City (JP)

(73) Assignee: DENSO CORPORATION, Kariya-city (JP)

( * ) Notice: Subject to any disclaimer, the term of this patent is extended or adjusted under 35 U.S.C. 154(b) by 194 days.

(21) Appl. No.: 18/412,814

(22) Filed: Jan. 15, 2024

(65) Prior Publication Data

US 2024/0155816 A1 May 9, 2024

Related U.S. Application Data

(63) Continuation of application No. PCT/JP2022/031547, filed on Aug. 22, 2022.

(30) Foreign Application Priority Data

Sep. 10, 2021 (JP) ................................. 2021-147859

(51) Int. Cl.
*H05K 7/20* (2006.01)
*H05K 9/00* (2006.01)

(52) U.S. Cl.
CPC ....... *H05K 7/20863* (2013.01); *H05K 9/0022* (2013.01)

(58) Field of Classification Search
None
See application file for complete search history.

(56) References Cited

U.S. PATENT DOCUMENTS

| 5,473,510 | A | * | 12/1995 | Dozier, II | ........... H01L 23/4006 |
| | | | | | 439/91 |
| 5,619,399 | A | * | 4/1997 | Mok | .................... H05K 7/1061 |
| | | | | | 257/E23.084 |
| 8,599,560 | B2 | * | 12/2013 | Wu | ........................... G06F 1/20 |
| | | | | | 174/547 |
| 8,681,501 | B2 | * | 3/2014 | Govindasamy | ......... G06F 1/203 |
| | | | | | 174/16.3 |
| 8,749,980 | B2 | * | 6/2014 | Won | ..................... H05K 5/0278 |
| | | | | | 361/720 |
| 11,246,244 | B2 | * | 2/2022 | Denk | ................. H05K 7/14329 |
| 11,324,148 | B2 | * | 5/2022 | Hampo | ................ H05K 1/0209 |
| 2011/0199747 | A1 | * | 8/2011 | Ishii | ....................... H05K 3/368 |
| | | | | | 361/784 |

(Continued)

FOREIGN PATENT DOCUMENTS

| JP | H01321697 A | 12/1989 |
| JP | H06069668 A | 3/1994 |

(Continued)

*Primary Examiner* — Courtney L Smith
(74) *Attorney, Agent, or Firm* — Harness, Dickey & Pierce, P.L.C.

(57) ABSTRACT

An electronic device includes: an intermediate frame positioned between an upper case and a bottom case; an upper substrate provided above the intermediate frame; and a lower substrate provided below the intermediate frame. The intermediate frame includes a positioning portion that performs positioning in an up-down direction with respect to the upper substrate and the lower substrate. The upper case, the upper substrate, the intermediate frame, the lower substrate, and the bottom case are integrally connected by a collective fastener.

14 Claims, 24 Drawing Sheets

(56) References Cited

U.S. PATENT DOCUMENTS

| 2011/0286183 A1* | 11/2011 | Chiu-Mao .......... H05K 7/20218 |
| | | 361/699 |
| 2012/0001341 A1* | 1/2012 | Ide ........................ H01L 25/117 |
| | | 257/773 |
| 2014/0098509 A1 | 4/2014 | Tomoe et al. |
| 2020/0144223 A1 | 5/2020 | Tamayama |
| 2021/0022264 A1 | 1/2021 | Takaki |
| 2021/0078783 A1 | 3/2021 | Takahashi et al. |

FOREIGN PATENT DOCUMENTS

| JP | 2013207161 A | 10/2013 |
| JP | 2013218870 A | 10/2013 |
| JP | 2014078783 A | 5/2014 |
| JP | 2019096766 A | 6/2019 |
| JP | 2020115512 A | 7/2020 |
| JP | 2020137323 A | 8/2020 |
| JP | 2021015946 A | 2/2021 |
| JP | 2021039958 A | 3/2021 |
| JP | 2021042841 A | 3/2021 |

* cited by examiner

FIG. 5

ELECTRONIC DEVICE

CROSS REFERENCE TO RELATED APPLICATIONS

The present application is a continuation application of International Patent Application No. PCT/JP2022/031547 filed on Aug. 22, 2022, which designated the U.S. and claims the benefit of priority from Japanese Patent Application No. 2021-147859 filed on Sep. 10, 2021. The entire disclosures of all of the above applications are incorporated herein by reference.

TECHNICAL FIELD

The present disclosure relates to an electronic device.

BACKGROUND

A vehicle such as an automobile is equipped with various electronic devices such as electronic control unit (ECU). The electronic device has a case housing a circuit board on which a heat-generating electronic component such as a CPU is mounted. In order to cool the electronic component, an intake port and an exhaust port are provided in the housing.

SUMMARY

An electronic device includes: an intermediate frame positioned between an upper case and a bottom case; an upper substrate provided above the intermediate frame; and a lower substrate provided below the intermediate frame. The intermediate frame includes a positioning portion that performs positioning in an up-down direction with respect to the upper substrate and the lower substrate. The upper case, the upper substrate, the intermediate frame, the lower substrate, and the bottom case are integrally connected by a collective fastener.

BRIEF DESCRIPTION OF DRAWINGS

FIG. 5 is a sectional view illustrating an assembly procedure of the electronic device.

DETAILED DESCRIPTION

Figures 1, 2:
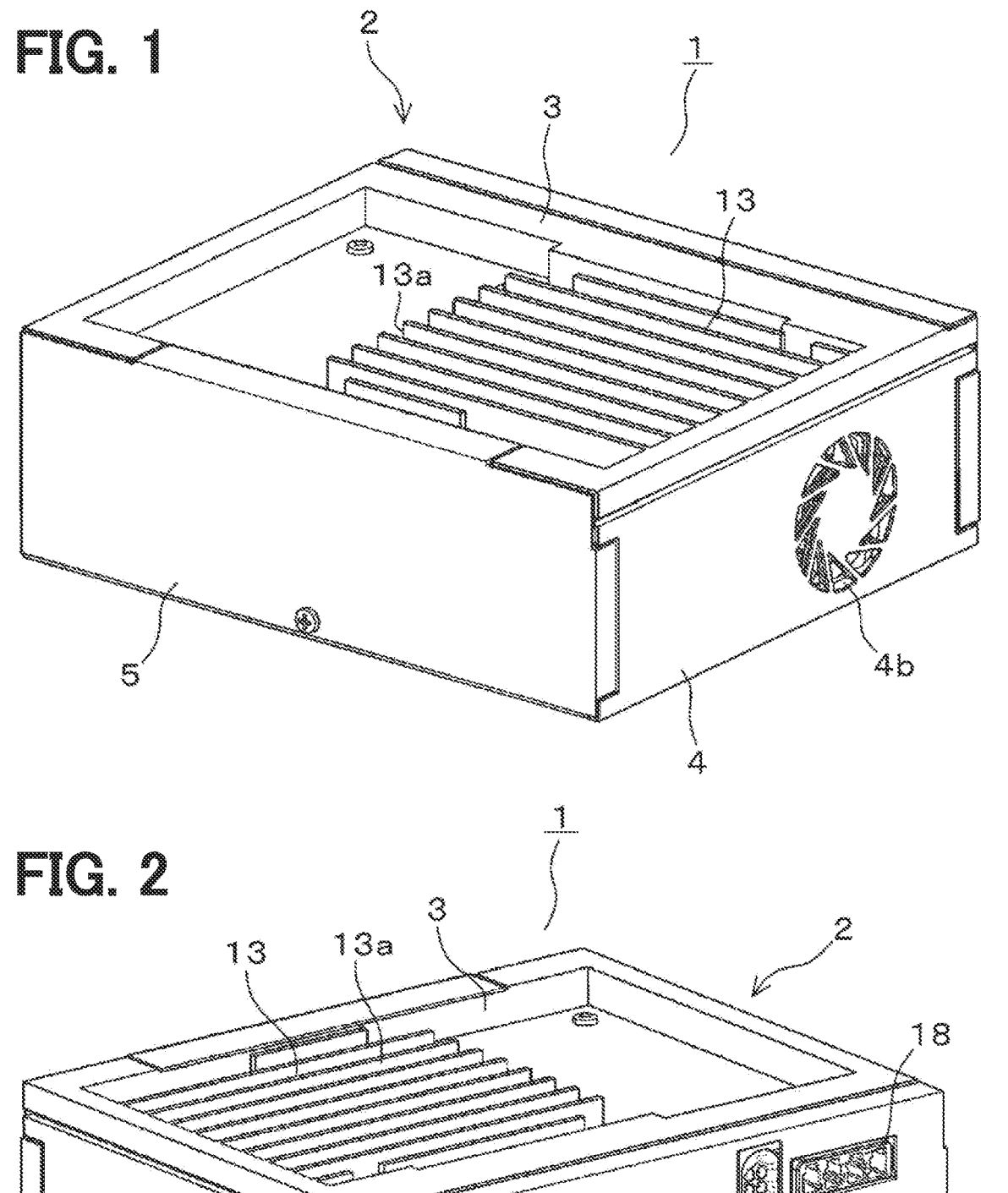
FIG. 1 is a perspective view illustrating an electronic device according to a first embodiment.
FIG. 2 is a perspective view illustrating the electronic device from the rear side.

A vehicle such as an automobile is equipped with various electronic devices. For example, an electronic control unit (ECU) is a control device to control a multimedia unit or a car navigation system. The electronic device has a housing for a circuit board on which a heat-generating electronic component such as a CPU is mounted. In order to cool the electronic component, an intake port and an exhaust port are provided in the left wall and the right wall of the housing respectively. In addition, a heat sink having fins for radiating heat of the electronic component, or/and a cooling fan device for flowing cooling air into the housing may be provided in the housing.

In the electronic device, plural substrates are required, for example, a power supply substrate and a CPU substrate are separately provided, in accordance with high functionality and miniaturization. In this case, the power supply substrate is attached to a case constituting a bottom portion of the housing by screwing, and then the CPU board is attached on the power supply board through a spacer by screwing. Further, it is necessary to mount the heat sink on the CPU substrate and then a cover constituting an upper portion of the housing is attached to the case by screwing. The number of screws to be used is increased, and the number of assembling steps is increased.

The present disclosure provides an electronic device including plural substrates in a housing, to simplify the configuration and improve the assemblability.

In a first aspect of the present disclosure, an electronic device includes a substrate on which an electronic component is mounted in a housing. The housing includes an upper case and a bottom case. An intermediate frame is positioned between the upper case and the bottom case in the housing. The substrate includes an upper substrate provided above the intermediate frame and a lower substrate provided below the intermediate frame. The intermediate frame includes a positioning portion that performs positioning in an up-down direction with respect to the upper substrate and the lower substrate. The upper case, the upper substrate, the intermediate frame, the lower substrate, and the bottom case are integrally connected by a collective fastener.

Accordingly, the upper substrate and the lower substrate are provided in the housing so as to be positioned above and below the intermediate frame, respectively, between the upper case and the bottom case. At this time, the positioning is performed in the up-down direction with respect to the upper substrate and the lower substrate by a positioning portion provided in the intermediate frame. The upper case, the upper substrate, the intermediate frame, the lower substrate, and the bottom case are collectively connected by the collective fastener.

At this time, the number of fasteners can be reduced as compared with a case where plural substrates are individually attached by the respective screwing. As a result, the number of assembling steps can be reduced, and the configuration is simplified to downsize. Accordingly, it is possible to achieve an effect of simplifying the configuration and improving the assemblability when the substrates are provided in the housing.

Figure 9:
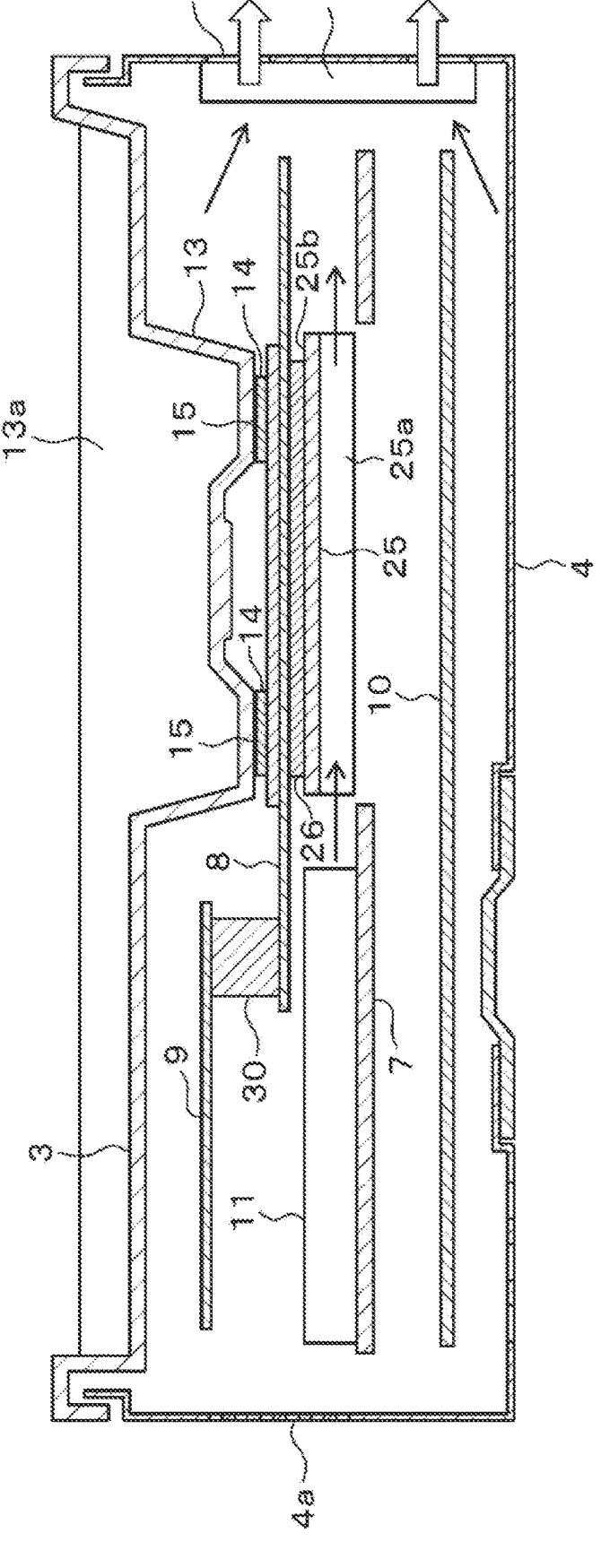
FIG. 9 is a sectional view illustrating a flow of air for cooling.

Hereinafter, embodiments will be described with reference to the drawings in which the present disclosure is applied to an electronic control unit (ECU) for an automobile as an electronic device. The electronic device is mounted on, for example, an instrument panel of an automobile. When directions are referred to in the drawings and the following description, for convenience, a longitudinal direction of the housing corresponds to a left-right direction, as shown in FIG. 9 illustrating the front side. Among the embodiments, the same portions are denoted by the same reference numerals, and the repeated description will be omitted.

First Embodiment

Figure 3:
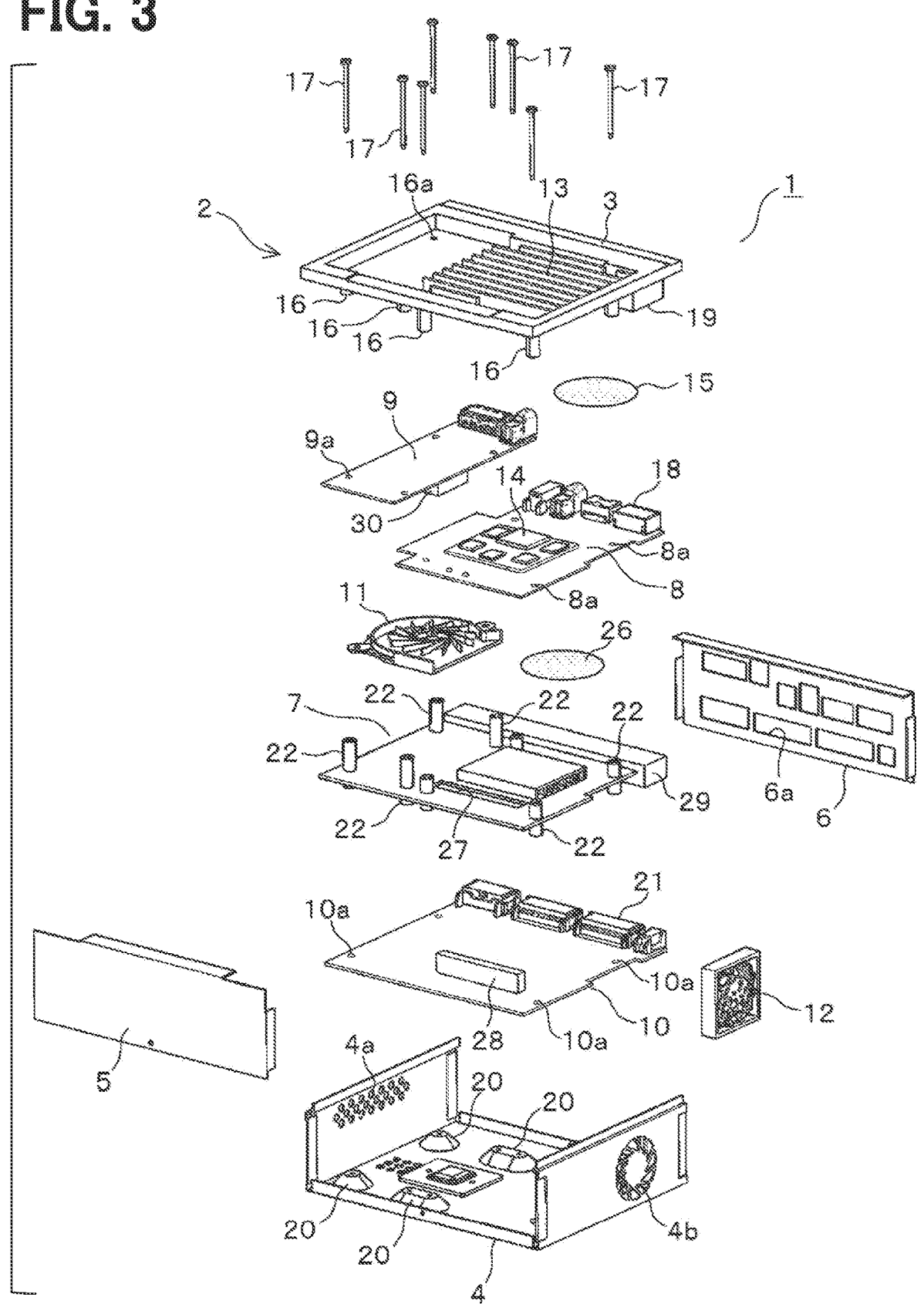
FIG. 3 is an exploded perspective view of the electronic device.
Figure 4:
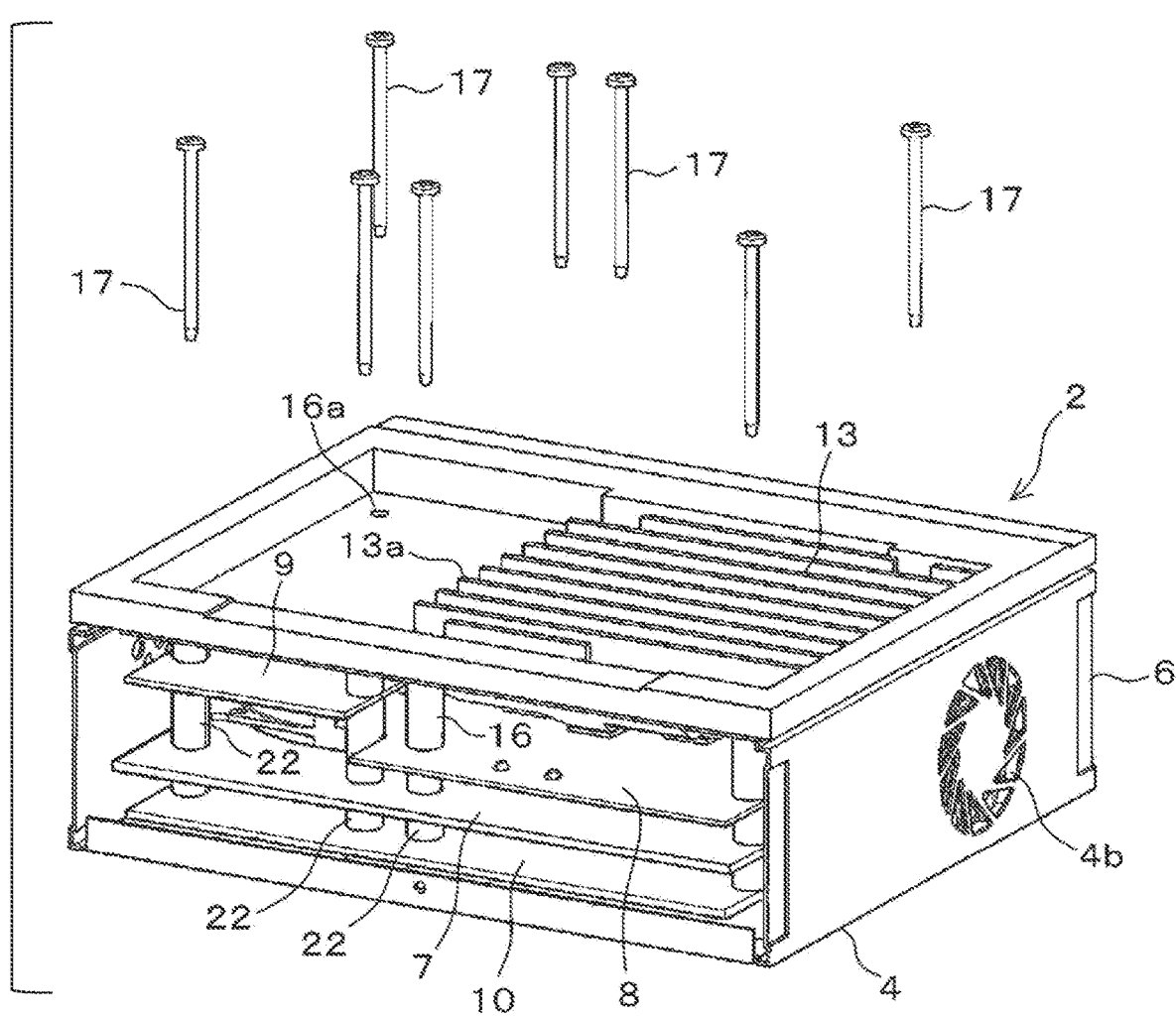
FIG. 4 is a perspective view illustrating the electronic device before a long screw is fastened in a state where the front cover is removed.

A first embodiment will be described with reference to FIGS. 1 to 10. FIGS. 1 and 2 schematically show an overall external configuration of an electronic device 1 according to the present embodiment. The electronic device 1 includes a housing 2. The housing 2 is made of a metal such as aluminum as a whole, and has a rectangular box shape defining a thickness direction along the up-down direction and slightly long in the left-right direction. As shown in FIG. 3, the housing 2 includes an upper case 3, a bottom case 4, a front cover 5, and a rear cover 6.

As shown in FIG. 3, an intermediate frame 7 is provided in the housing 2 between the upper case 3 and the bottom case 4. A CPU substrate 8 and an extension substrate 9 are provided above the intermediate frame 7 in the housing 2 as upper substrate. A power supply substrate 10 is provided below the intermediate frame 7 as lower substrate. Further, a first cooling fan device 11 and a second cooling fan device 12 are provided in the housing 2. Hereinafter, details of each component will be described.

Figure 10:
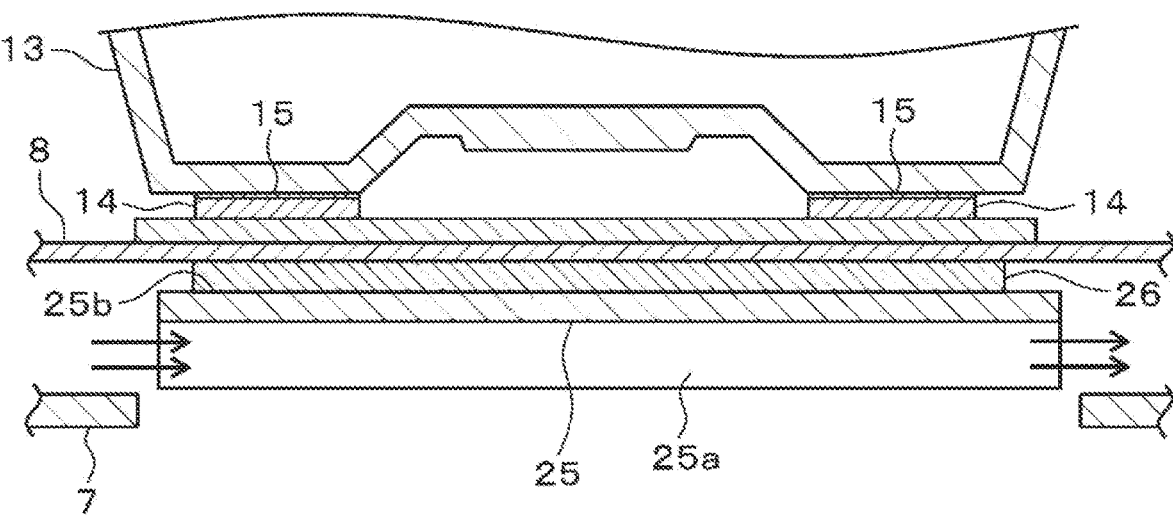
FIG. 10 is an enlarged sectional view of the electronic device.
Figure 11:
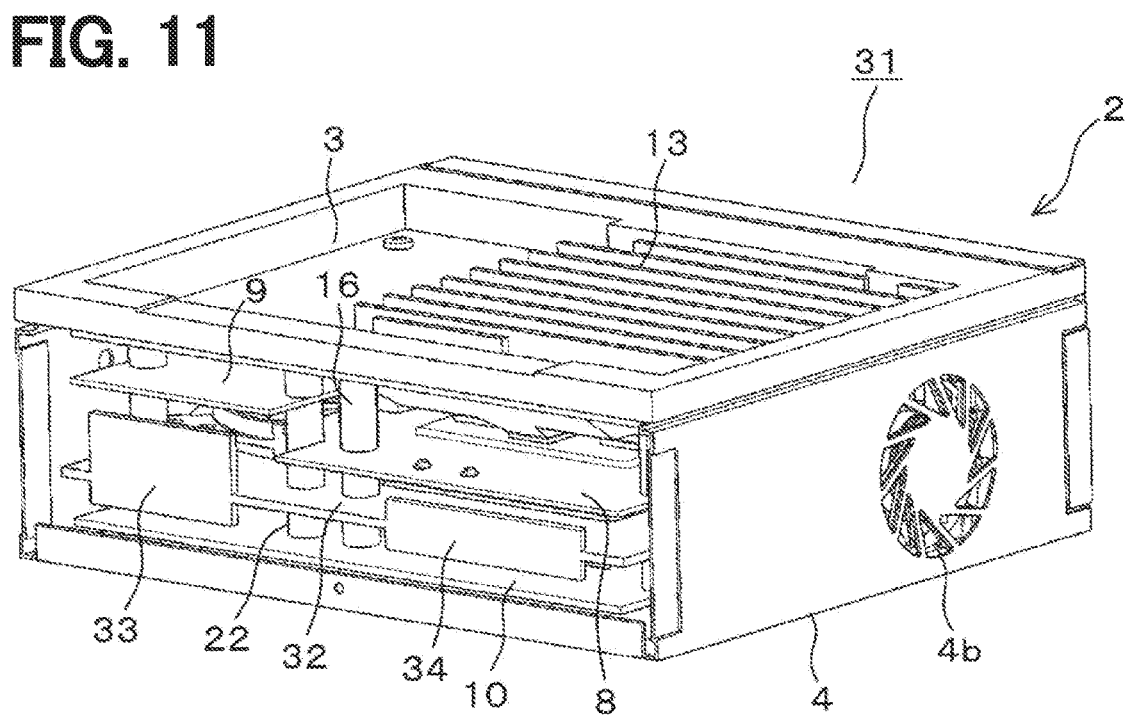
FIG. 11 is a perspective view illustrating an electronic device according to a second embodiment in which the front cover is removed.

As shown in FIGS. 1 to 4, the upper case 3 of the housing 2 forms a ceiling surface of the housing 2, and has a rectangular shape slightly longer in the lateral direction. As shown in FIGS. 9 and 11, the upper surface of the upper case 3 is integrally provided with a heat sink 13 having heat dissipation fins 13a located on the right side except for the left end. As shown in FIG. 10, the bottom portion of the heat sink 13 has a downward convex shape. A heat generating electronic component 14 such as a CPU is mounted on the CPU substrate 8, and is in thermal contact with the bottom surface of the heat sink 13 via a heat dissipation gel 15.

Figure 6:
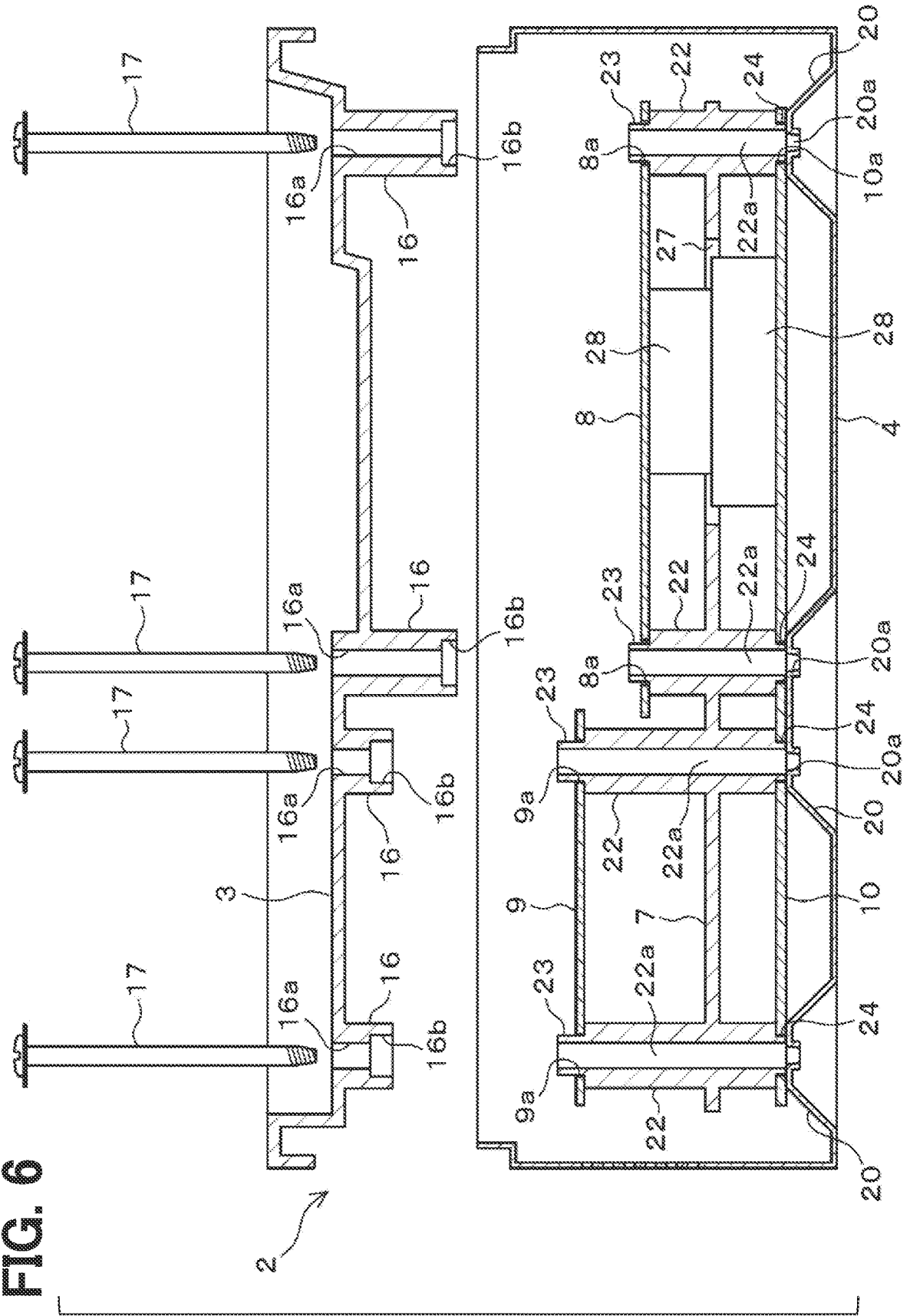
FIG. 6 is a sectional view illustrating an assembly procedure of the electronic device.

As shown in FIG. 3, the upper case 3 has cylindrical boss portions 16 protruding downward, for example, at a total of eight positions defined by four rows in the lateral direction and two rows in the front-rear direction. The boss portion 16 has a screw insertion hole 16a passing through in the up-down direction, and a long screw 17 as a collective fastener is inserted in the screw insertion hole 16a. As shown in FIG. 6, a fitting recess 16b for positioning the intermediate frame 7 is formed at a lower end of the boss portion 16.

As shown in FIG. 6, among the boss portions 16 of the upper case 3 protruding downward, the four boss portions on the left side and the four boss portions on the right side have different length dimensions. The four boss portions on the left side are shorter and the four boss portions on the right side are longer than those on the left side. In the present embodiment, as partially shown in FIG. 3, an upper shield portion 19 for shielding noise is integrally provided on the bottom surface of the upper case 3 so as to cover the upper connector 18 for external connection disposed on the rear side of the CPU substrate 8.

Figure 7:
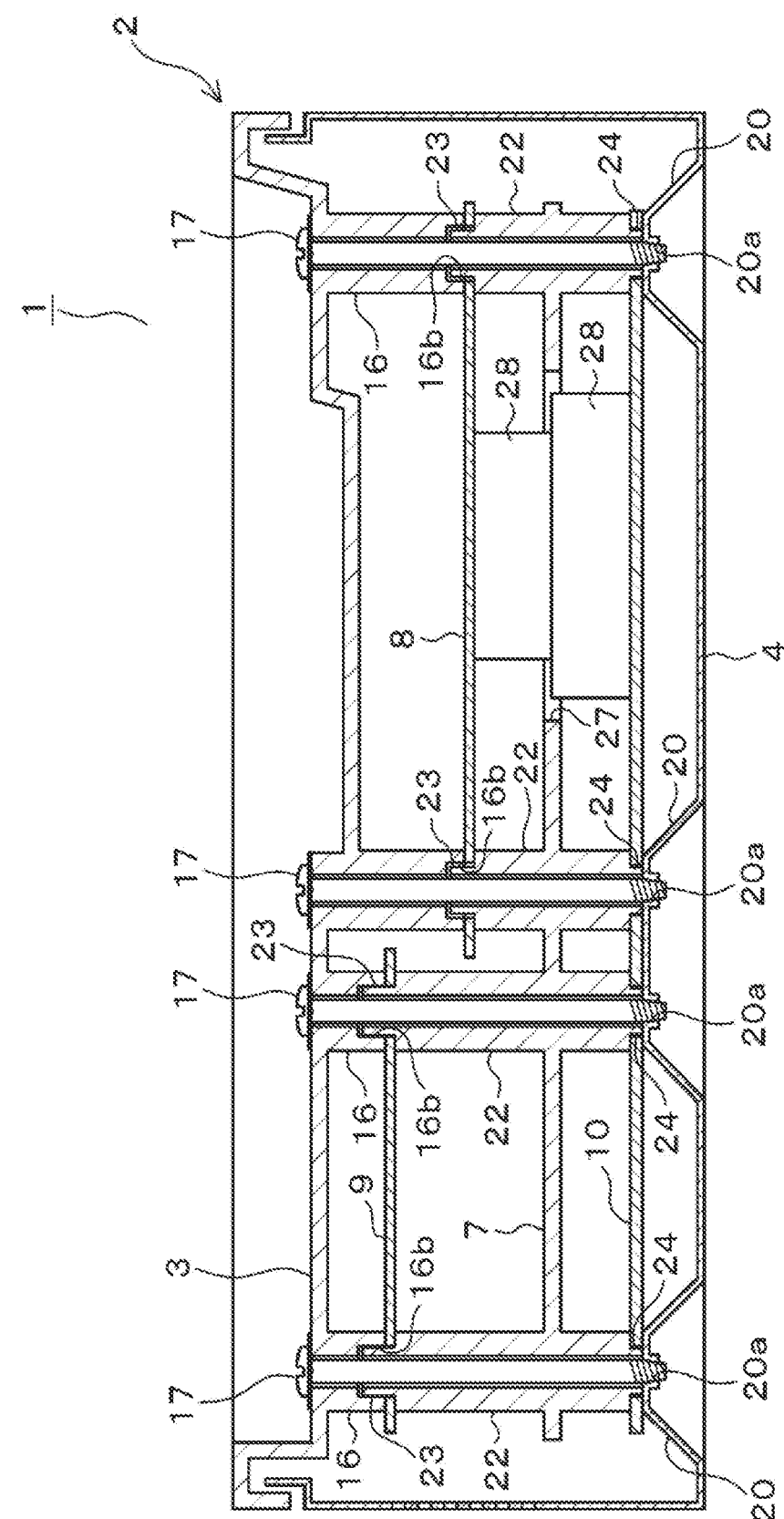
FIG. 7 is a sectional view illustrating an assembly procedure of the electronic device.
Figure 8:
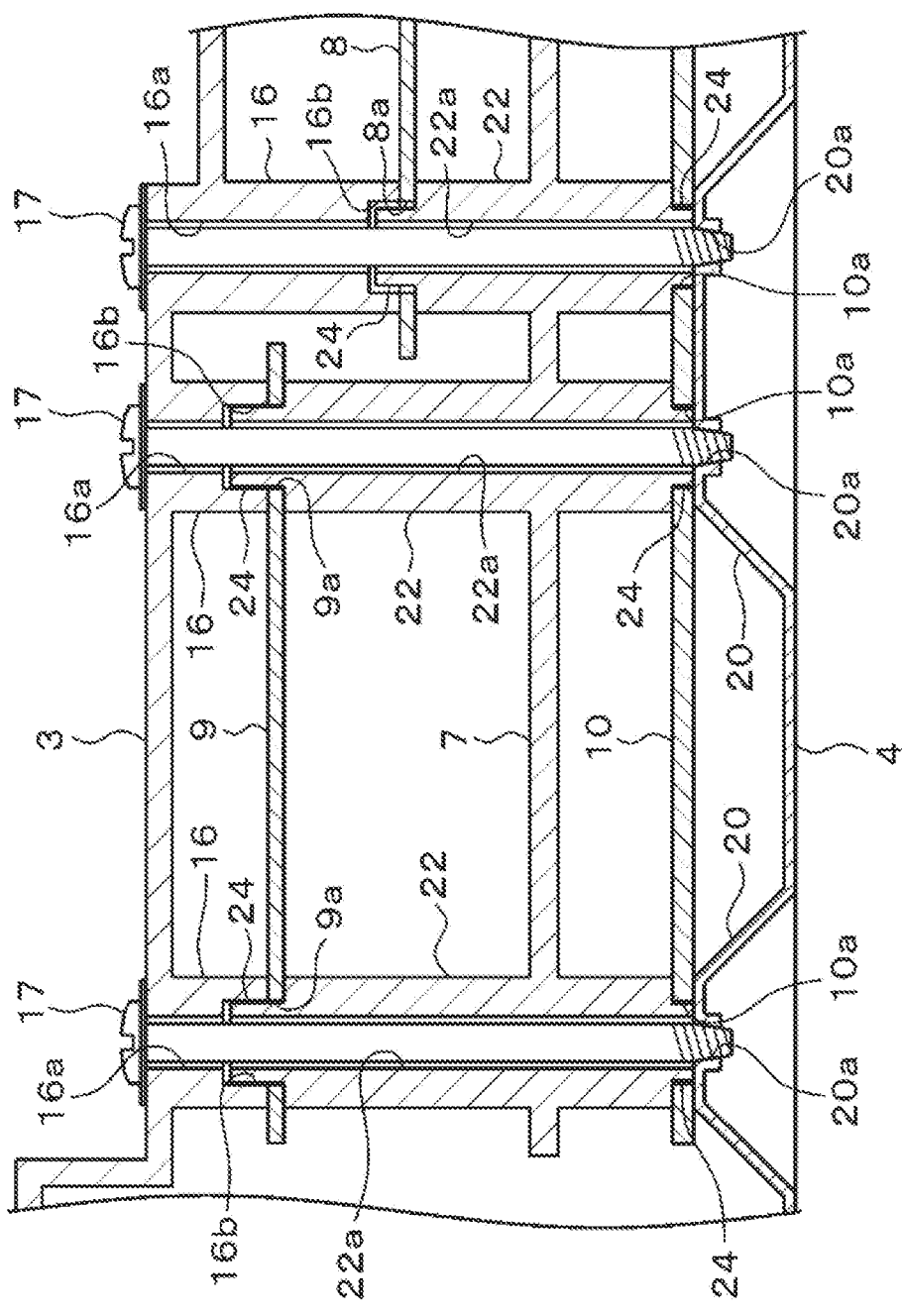
FIG. 8 is an enlarged sectional view of the electronic device.

As shown in FIG. 3, the bottom case 4 defines a bottom surface and lateral surface of the housing 2. An air inlet 4a for taking outside air into the housing 2 is formed in the left side of the bottom case 4. An exhaust port 4b for discharging air out of the housing 2 is formed in the right side of the bottom case 4. The second cooling fan device 12 including a propeller fan is provided in the exhaust port 4b. The bottom surface of the bottom case 4 has mounting protrusions 20 protruding upward and inward of the housing 2 to receive the lower surface of the power supply substrate 10. As shown in FIGS. 7 and 8, a screw hole 20a to which the long screw 17 is fastened is formed in the upper surface of the mounting protrusion 20 at position corresponding to the boss portions 16.

As shown in FIG. 3, the front cover 5 is provided to cover the front surface of the housing 2. The rear cover 6 is provided to cover the rear surface of the housing 2. The rear cover 6 has openings 6a for connecting an external cable to the upper connector 18 or a lower connector 21 provided on the power supply substrate 10. The electronic device 1 is connected to the outside such as another ECU in the vehicle via the upper connector 18 and the lower connector 21. Although not shown in detail, the front cover 5 and the rear cover 6 are coupled to the upper case 3 and the bottom case 4 by engagement between holes and protrusions, fitting, screwing, or the like.

Figure 5:
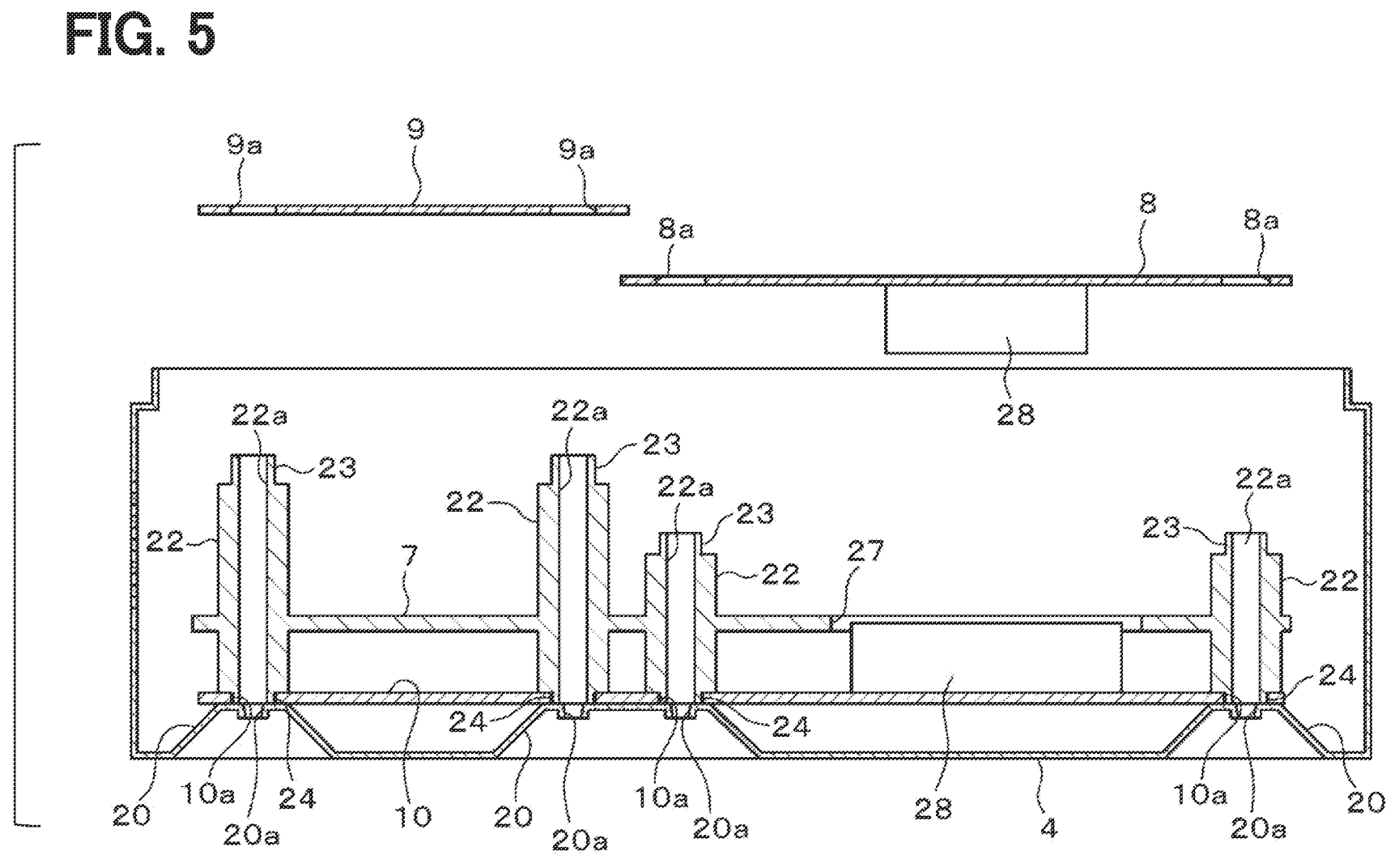

The configuration of the intermediate frame 7 and the periphery thereof will be described. The intermediate frame 7 is made of, for example, an aluminum die-cast product and has the following configuration. As shown in FIG. 3, the intermediate frame 7 has a main plate having a rectangular plate shape arranged horizontally in the housing 2, and integrally includes a cylindrical boss portion 22 extending in the up-down direction from the main plate. The boss portion 22 is provided at eight positions corresponding to the boss portions 16 and the screw holes 20a. The boss portion 22 has a screw insertion hole 22a penetrating through the boss portion 22 in the up-down direction. As shown in FIG. 5, among the boss portions 22, the four boss portions on the left side have a larger protruding height in the upward direction than the four boss portions on the right side.

As shown in FIG. 6, an upper end of the boss portion 22 integrally has an upper fitting protrusion 23 serving as upper fitting to which the CPU substrate 8 and the extension substrate 9 serving as upper substrate are fitted. The upper fitting protrusion 23 protrudes upward from the upper end of the boss portion 22 with a slightly smaller diameter. The upper fitting protrusion 23 is fitted with the fitting hole 8*a* of the CPU substrate 8 and the fitting hole 9*a* of the extension substrate 9, which are located on the upper end of the boss portion 22. The fitting recess 16*b* at the lower end of the boss portion 16 of the upper case 3 is fitted to the upper end of the upper fitting protrusion 23 of the boss portion 22.

Similarly, a lower end of the boss portion 22 integrally has a lower fitting protrusion 24 serving as a lower fitting to which the power supply substrate 10 is fitted. The lower fitting protrusion 24 protrudes downward from the lower end of the boss portion 22 with a slightly smaller diameter, and is fitted into the fitting hole 10*a* of the power supply substrate 10 disposed below the boss portion 22. The protruding dimension of the lower fitting protrusion 24 substantially matches the thickness dimension of the power supply substrate 10. Thus, in the present embodiment, the boss portion 22 of the intermediate frame 7 functions as a positioning portion that positions the CPU substrate 8 and the extension substrate 9 as the upper substrate and the power supply substrate 10 as the lower substrate in the up-down direction and the lateral direction, that is, the horizontal direction.

In addition, as shown in FIGS. 9 and 10, the upper surface of the intermediate frame 7 has a fin forming portion 25 located in a rectangular region close to the right side. The fin forming portion 25 has radiation fins 25*a* arranged in the front-rear direction. The radiation fin 25*a* is long in the left-right direction. The fin forming portion 25 is opened at both left and right ends and the lower surface, such that cooling air flows from left to right in FIG. 9. At this time, the first cooling fan device 11 is formed of, for example, a centrifugal fan device, and is provided on the left side of the upper surface of the intermediate frame 7. As shown in FIGS. 9 and 10, the fin forming portion 25 has a flat ceiling surface 25*b* at the upper portion, and the ceiling surface 25*b* is thermally connected to a lower surface of the CPU substrate 8 via a heat dissipation gel 26.

As shown in FIG. 9, when the first cooling fan device 11 and the second cooling fan device 12 are driven, outside air is sucked from the intake port 4*a*, passes through the housing 2 as cooling air, and is discharged from the exhaust port 4*b*. As shown in FIG. 10, the cooling air generated by the first cooling fan device 11 is subjected to heat exchange through the fin forming portion 25, and contributes to heat dissipation from the CPU substrate 8 and cooling of the electronic component 14. Thus, the intermediate frame 7 also functions as a heat sink.

Further, in the present embodiment, as shown in FIG. 3, the intermediate frame 7 has a slit 27 as a hole provided in a horizontally long manner. The slit 27 is positioned on the front side of the fin forming portion 25. As shown in FIGS. 5 and 6, an inter-substrate connector 28 electrically connects the substrates provided on the lower surface of the CPU substrate 8 and the upper surface of the power supply substrate 10. The inter-substrate connector 28 on the CPU substrate 8 and the inter-substrate connector 28 on the power supply substrate 10 are connected with each other through the slit 27. As shown in FIG. 3, the intermediate frame 7 integrally has a lower shield portion 29 located on the lower surface of the rear side so as to cover the lower connector 21 for external connection arranged on the rear side of the power supply substrate 10 to shield noise.

The CPU substrate 8 has a rectangular shape, and electronic components including the electronic component 14 are mounted on the upper surface to configure a control circuit and the like. As shown in FIG. 8, the CPU substrate 8 has four fitting holes 8*a* corresponding to the four upper fitting protrusions 23 on the right side of the boss portion 22. The extension substrate 9 is formed of, for example, a radio board, has a rectangular shape slightly smaller than the CPU substrate 8, and has four fitting holes 9*a* corresponding to the four upper fitting protrusions 23 on the left side of the boss portion 22.

The extension substrate 9 is disposed at a position slightly higher than the CPU substrate 8, on the left side, so as to partially overlap in the up-down direction. As shown in FIG. 9, an inter-substrate connector 30 is provided on the right end of the lower surface of the extension substrate 9 and the left end of the upper surface of the CPU substrate 8. The extension substrate 9 and the CPU substrate 8 are electrically connected to each other by the inter-substrate connector 30. Plural components constituting a power supply circuit are mounted on the upper surface of the power supply substrate 10, and the power supply substrate has eight fitting holes 10*a* corresponding to the eight boss portions 22.

As shown in FIGS. 7 and 8, in the electronic device 1 of the present embodiment, the power supply substrate 10 is placed on the bottom case 4, and the intermediate frame 7 is placed on the power supply substrate 10. Further, the CPU substrate 8 and the extension substrate 9 are mounted on the intermediate frame 7, and the upper case 3 is mounted on the CPU substrate 8 and the extension substrate 9. In this state, the upper case 3, the intermediate frame 7, the CPU substrate 8 and the extension substrate 9 are collectively connected by the eight long screws 17 as collective fastener.

At this time, as will also be described later, the boss portion 22 of the intermediate frame 7 performs positioning in the up-down direction and the lateral direction with respect to the CPU substrate 8, the extension substrate 9, and the power supply substrate 10. Further, the upper fitting protrusion 23 at the upper end of the boss portion 22 is fitted with the fitting recess 16*b* of the boss portion 16 of the upper case 3 with the CPU substrate 8 and the extension substrate 9 interposed therebetween. At the same time, the lower fitting protrusion 24 at the lower end of the boss portion 22 is aligned with the screw hole 20*a* of the mounting protrusion 20 of the bottom case 4 across the power supply substrate 10.

Next, an assembly procedure of the electronic device 1 having the above-described configuration will be described with reference to FIGS. 5 to 8. In assembling the electronic device 1, as shown in FIG. 5, the power supply substrate 10 is placed in a horizontal state on the mounting protrusion 20 above the bottom case 4. At this time, the screw hole 20*a* of the mounting protrusion 20 and the fitting hole 10*a* of the power supply substrate 10 are aligned with each other, thereby positioning the power supply substrate 10 in the lateral direction. Thereafter, the intermediate frame 7 is placed on the power supply substrate 10. At this time, as shown in FIG. 8, the lower fitting protrusions 24 of the boss portions 22 at the eight positions of the intermediate frame 7 are aligned and fitted with the fitting holes 10*a* of the power supply substrate 10.

Next, the CPU substrate 8 and the extension substrate 9 are placed on the intermediate frame 7. At this time, as shown in FIGS. 6 and 8, the CPU substrate 8 is positioned in a horizontal state such that the fitting holes 8*a* at the four positions are fitted to the upper fitting protrusions 23 of the boss portions 22 at the four positions on the right side of the intermediate frame 7. Similarly, the extension substrate 9 is positioned such that the four fitting holes 9*a* are fitted to the upper fitting protrusions 23 of the four boss portions 22 of the intermediate frame 7 on the left side. As shown in FIG. 6, in this state, the inter-substrate connector 28 provided on the lower surface of the CPU substrate 8 and the inter-substrate connector 28 provided on the upper surface of the power supply substrate 10 are connected through the slit 27. As shown in FIG. 9, the inter-substrate connector 30 provided on the lower surface of the extension substrate 9 and the inter-substrate connector 30 provided on the upper surface of the CPU substrate 8 are connected.

Thereafter, as shown in FIGS. 6 and 7, the upper case 3 is placed on the CPU substrate 8 and the extension substrate 9, that is, on the boss portions 22 at the eight positions of the intermediate frame 7. At this time, the fitting recess 16*b* of the eight boss portions 16 provided on the lower surface of the upper case 3 are fitted and positioned to the upper fitting protrusions 23 of the boss portions 22, respectively, across the CPU substrate 8 or the extension substrate 9. Accordingly, the screw insertion hole 16*a* of the boss portions 16 of the upper case 3, the screw insertion hole 22*a* of the boss portion 22 of the intermediate frame 7, and the screw hole 20*a* of the mounting protrusion 20 of the bottom case 4 are continuous in a straight line in the up-down direction.

Then, as shown in FIGS. 7 and 8, the eight long screws 17 are respectively inserted into the screw insertion holes 16*a* of the upper case 3 from the upper side to pass through the screw insertion holes 22*a* of the boss portions 22, and fastened to the screw holes 20*a* of the bottom case 4. Thus, the upper case 3, the CPU substrate 8, the extension substrate 9, the intermediate frame 7, the power supply substrate 10, and the bottom case 4 are integrally connected by the long screws 17. Although detailed illustration and description are omitted, the front cover 5 and the rear cover 6 are connected to the bottom case 4 and the upper case 3 by an appropriate method such as engagement between a claw and a hole, fitting, or separate screwing.

According to the electronic device 1, the housing 2 houses the CPU substrate 8 and the extension substrate 9 located on the upper side and the power supply substrate 10 located on the lower side, and the intermediate frame 7 is provided in the housing 2. The intermediate frame 7 has the boss portion 22 as a positioning portion, for positioning in the up-down direction and the lateral direction with respect to the CPU substrate 8, the extension substrate 9, and the power supply substrate 10. Then, the upper case 3, the CPU substrate 8 and the extension substrate 9, the intermediate frame 7, the power supply substrate 10, and the bottom case 4 are collectively connected by the long screw 17 as collective fastener.

In the assembly structure of the electronic device 1 of the present embodiment, the number of fasteners such as screws can be reduced as compared with a case where substrates are individually assembled in the housing 2 by screwing or the like. In addition, the number of assembling steps can be reduced, and the configuration for fastening is simplified, leading to downsizing. As a result, according to the present embodiment, it is possible to obtain an excellent effect that the configuration can be simplified and the assemblability can be improved when the plural substrates are housed in the housing 2.

In the present embodiment, the upper fitting protrusion 23 to be fitted to the CPU substrate 8 and the extension substrate 9 is provided at the upper end of the boss portion

22 of the intermediate frame 7, and the lower fitting protrusion 24 to be fitted to the power supply substrate 10 is provided at the lower end of the boss portion 22. The upper fitting protrusion 23 is fitted into the fitting recess 16*b* of the upper case 3 with the CPU substrate 8 and the extension substrate 9 interposed therebetween, and the lower fitting protrusion 24 is fitted into the bottom case 4 with the power supply substrate 10 interposed therebetween. Thus, the boss portion 22 of the intermediate frame 7 can position the CPU substrate 8, the extension substrate 9, and the power supply substrate 10 in the lateral direction in addition to the positioning in the up-down direction. In addition, it is possible to position the upper case 3 and the bottom case 4 and thus to perform the entire positioning. In this case, the number of the positioning portions and the overall configuration can be simplified.

The electronic device 1 is required to be sufficiently downsized. In addition, in order to cope with an increase in the amount of heat generation due to an increase in the performance of the electronic component 14 such as a CPU, a higher cooling effect is required particularly for the electronic component 14 which is a heat generating component mounted on the CPU substrate 8. In the present embodiment, the following configuration is adopted as a cooling structure for cooling the electronic component 14 of the CPU substrate 8.

The intermediate frame 7 is an aluminum die-cast product integrally including the fin forming portion 25 to function as a heat sink for dissipating heat from the CPU substrate 8. At this time, as shown in FIGS. 9 and 10, the lower surface of the CPU substrate 8 is in close contact with and thermally connected to the ceiling surface 25*b* of the fin forming portion 25 via the heat dissipation gel 26. At the same time, the upper surface of the packages of the electronic component 14 mounted on the upper surface of the CPU substrate 8 is in thermal contact with the bottom of the heat sink 13 of the upper case 3 via the heat dissipation gel 15.

In the present embodiment, as shown in FIG. 9, the first cooling fan device 11 provided on the upper surface of the intermediate frame 7 and the second cooling fan device 12 provided on the right side in the housing 2 are driven. As a result, outside air is sucked from the intake port 4*a*, and is discharged from the exhaust port 4*b* as cooling air passing through the housing 2. As shown in FIG. 10, the cooling air generated by the first cooling fan device 11 is subjected to heat exchange through the radiation fin 25*a* of the fin forming portion 25, and contributes to heat dissipation from the CPU substrate 8 and cooling of the electronic component 14.

With the above configuration, the intermediate frame 7 also serves as a heat sink that dissipates heat from the CPU substrate 8, in addition to serving as a spacer for positioning and aligning the substrates. As a result, it is possible to dissipate heat from the CPU substrate 8 via the fin forming portion 25 of the intermediate frame 7, and it is possible to simplify the configuration and reduce the size of the entire device while enhancing the heat dissipation effect. The heat dissipation function from the intermediate frame 7 can be further enhanced by providing the first cooling fan device 11, and the heat dissipation effect can be enhanced. Furthermore, since the electronic component 14 on the CPU substrate 8 is thermally connected to the upper case 3, the heat dissipation effect from the CPU substrate 8 can be further enhanced.

In this case, in the heat dissipation structure shown in FIG. 10, it is desirable to reduce the gap between the electronic component 14 and the heat sink 13 and it is desirable to reduce the gap between the lower surface of the CPU substrate 8 and the ceiling surface 25*b* of the fin forming portion 25. Accordingly, the thickness of the heat dissipation gel 15 and the heat dissipation gel 26 can be reduced, and the thermal resistance can be reduced. Here, in the present embodiment, as illustrated in FIG. 8, the CPU substrate 8 and the upper case 3 are reliably positioned in the up-down direction with respect to the intermediate frame 7 at the upper end of the boss portion 22.

Accordingly, it is possible to suppress variations in the vertical positions of the intermediate frame 7, the CPU substrate 8, and the upper case 3 due to an assembly error to be small. Therefore, it is possible to manage the dimensions of the gap between the lower surface of the CPU substrate 8 and the ceiling surface 25*b* of the fin forming portion 25 and the gap between the electronic component 14 and the heat sink 13 with high accuracy. In addition, since the gap dimension can be sufficiently reduced, the thickness of the heat dissipation gel 15 and the heat dissipation gel 26 can be sufficiently reduced. As a result, the management of the thermal resistance becomes easy.

Furthermore, in the electronic device 1 of the present embodiment, the CPU substrate 8 and the power supply substrate 10 are connected by the inter-substrate connector 28 through the slit 27 provided in the intermediate frame 7. Accordingly, the electrical connection between the CPU substrate 8 on the upper side of the intermediate frame 7 and the power supply substrate 10 on the lower side can be easily performed with a simple configuration by the inter-substrate connector 28 without the intermediate frame 7 becoming an obstacle.

In the present embodiment, the lower shield portion 29 that covers the lower connector 21 of the power supply substrate 10 to shield noise is provided integrally with the intermediate frame 7. Accordingly, it is possible to perform a simple configuration without separately providing a configuration for shielding noise with respect to the lower connector 21, and an assembling operation is also facilitated. Further, the upper shield portion 19 that covers the upper connector 18 of the CPU substrate 8 to shield noise is integrally provided in the upper case 3. Accordingly, it is possible to perform a simple configuration without separately providing a configuration for shielding noise with respect to the upper connector 18, and an assembling operation is also facilitated.

Second Embodiment

Figure 12:
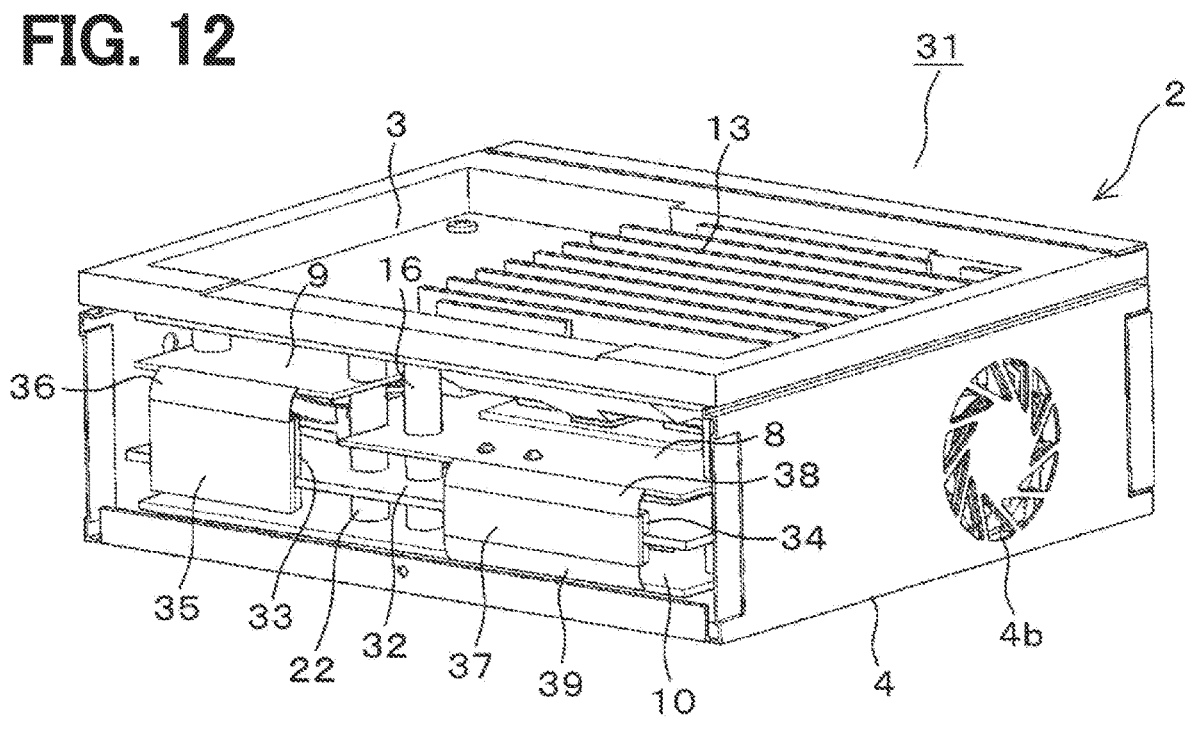
FIG. 12 is a perspective view illustrating the electronic device in which an additional substrate is attached to a mounting seat.

FIGS. 11 and 12 illustrate an electronic device 31 according to a second embodiment. The second embodiment is different from the first embodiment in the configuration of an intermediate frame 32. As shown in FIG. 11, a mounting seat 33 and a mounting seat 34 for fixing substrates are integrally provided on a side portion, in this case, on the front surface of the intermediate frame 32, and arranged adjacent to each other in the left-right direction. The mounting seat 33, 34 has a rectangular shape comparatively long in the lateral direction and is provided to receive an additional substrate on a surface facing the front side. Similar to the first embodiment, the intermediate frame 32 has the boss portion 22 as a positioning portion.

As illustrated in FIG. 12, an additional substrate 35 is attached to the front surface of the mounting seat 33, and the additional substrate 35 is electrically connected to the extension substrate 9 by a flexible wiring substrate 36 for connection. Further, another additional substrate 37 is attached to the front surface of the mounting seat 34 on the right side.

The additional substrate 37 and the CPU substrate 8 are connected by a flexible wiring substrate 38, and the additional substrate 37 and the power supply substrate 10 are connected by a flexible wiring substrate 39. According to the second embodiment, since the mounting seat 33, 34 is provided on the side portion of the intermediate frame 32, it is possible to easily add the substrates.

Third Embodiment

Figure 13:
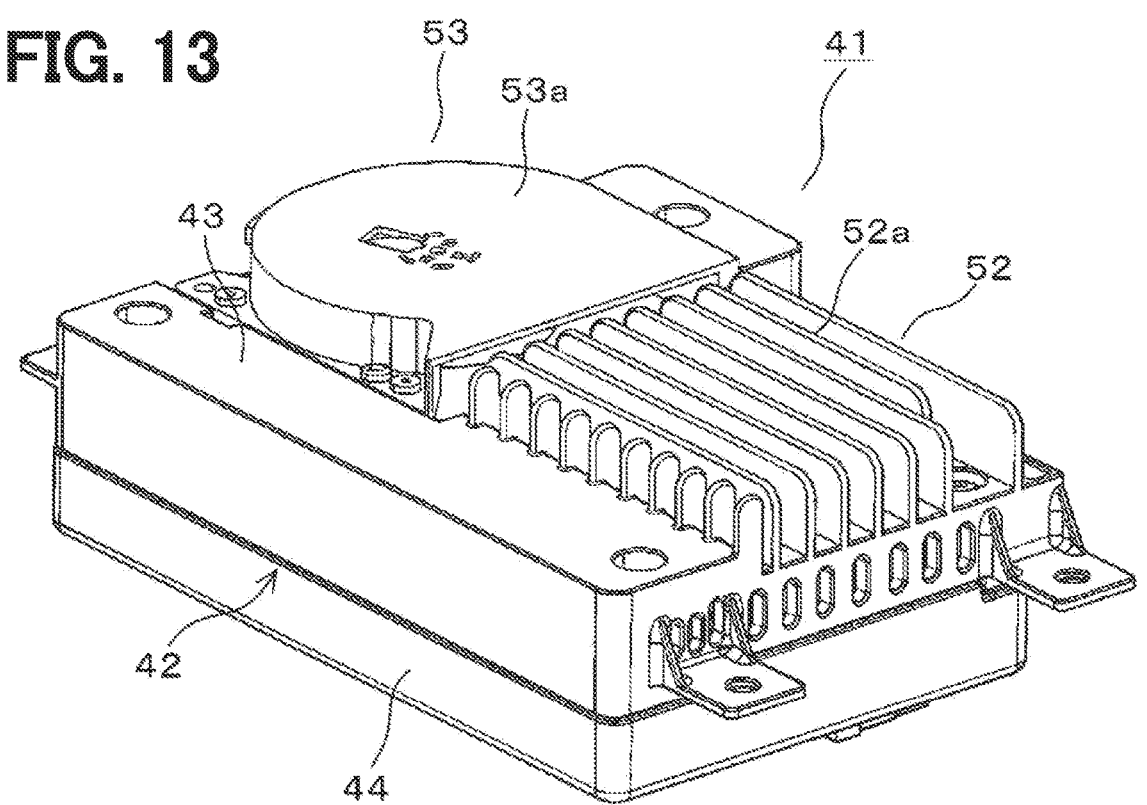
FIG. 13 is a perspective view illustrating an electronic device according to a third embodiment.
Figure 14:
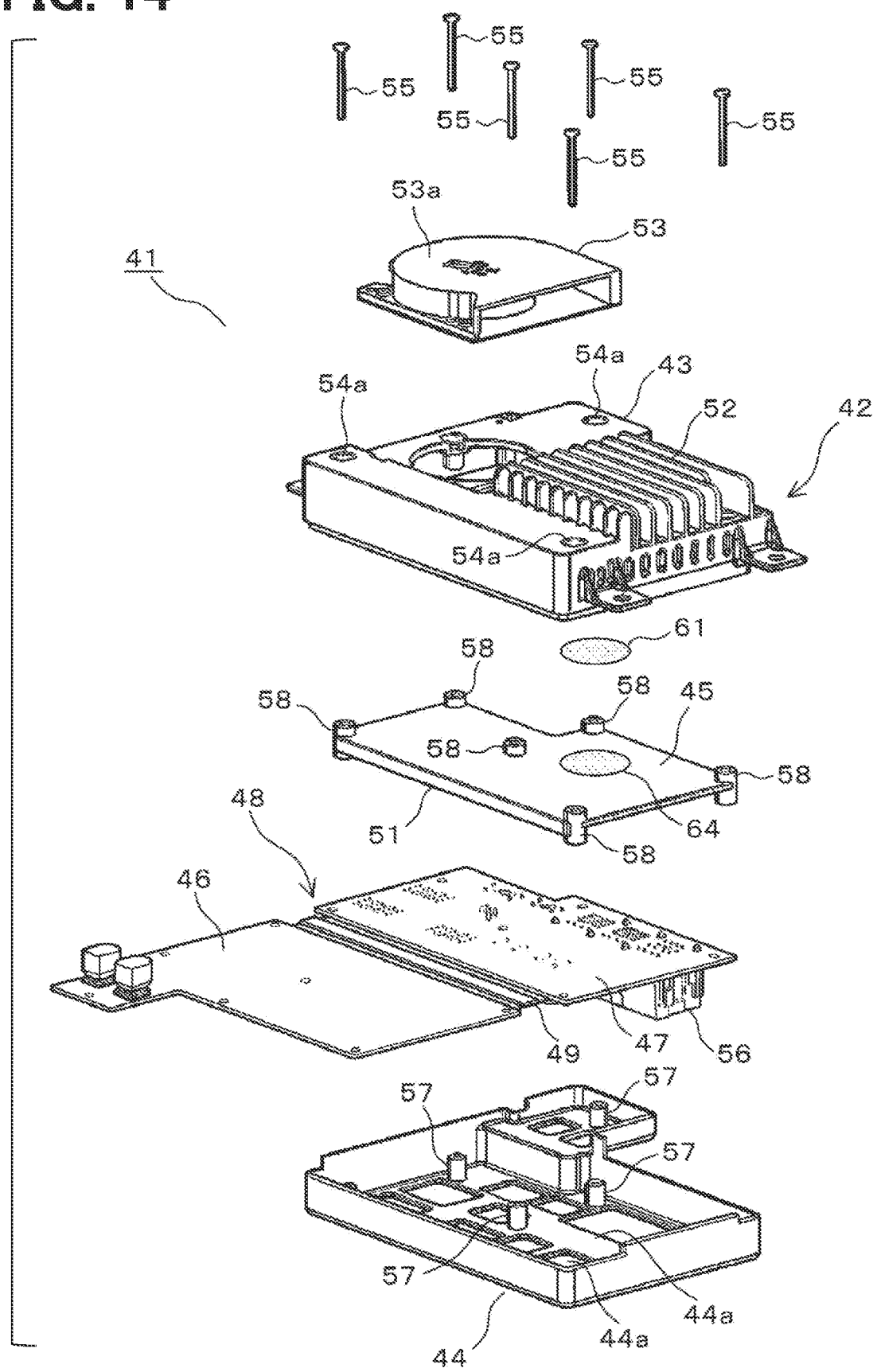
FIG. 14 is an exploded perspective view of the electronic device.

A third embodiment will be described with reference to FIGS. 13 to 23. FIG. 13 shows an external configuration of the electronic device 41 according to the present embodiment. FIG. 14 shows an exploded configuration of the electronic device 41. The housing 42 of the electronic device 41 includes, for example, an upper case 43 and a bottom case 44 made of aluminum die-cast, so as to have a substantially rectangular shape as a whole. An intermediate frame 45 made of aluminum die-cast is provided in the housing 42.

As shown in FIG. 14, a CPU substrate 46 as an upper substrate and a power supply substrate 47 as a lower substrate are provided in the housing 42 so as to be positioned above and below the intermediate frame 45 respectively. In the present embodiment, the CPU substrate 46 and the power supply substrate 47 are integrally connected by a rigid flexible substrate 48, and are assembled in a manner that the intermediate frame 45 is interposed between the CPU substrate 46 and the power supply substrate 47. The assembly configuration of the rigid flexible substrate 48 will be described later.

Figure 15:
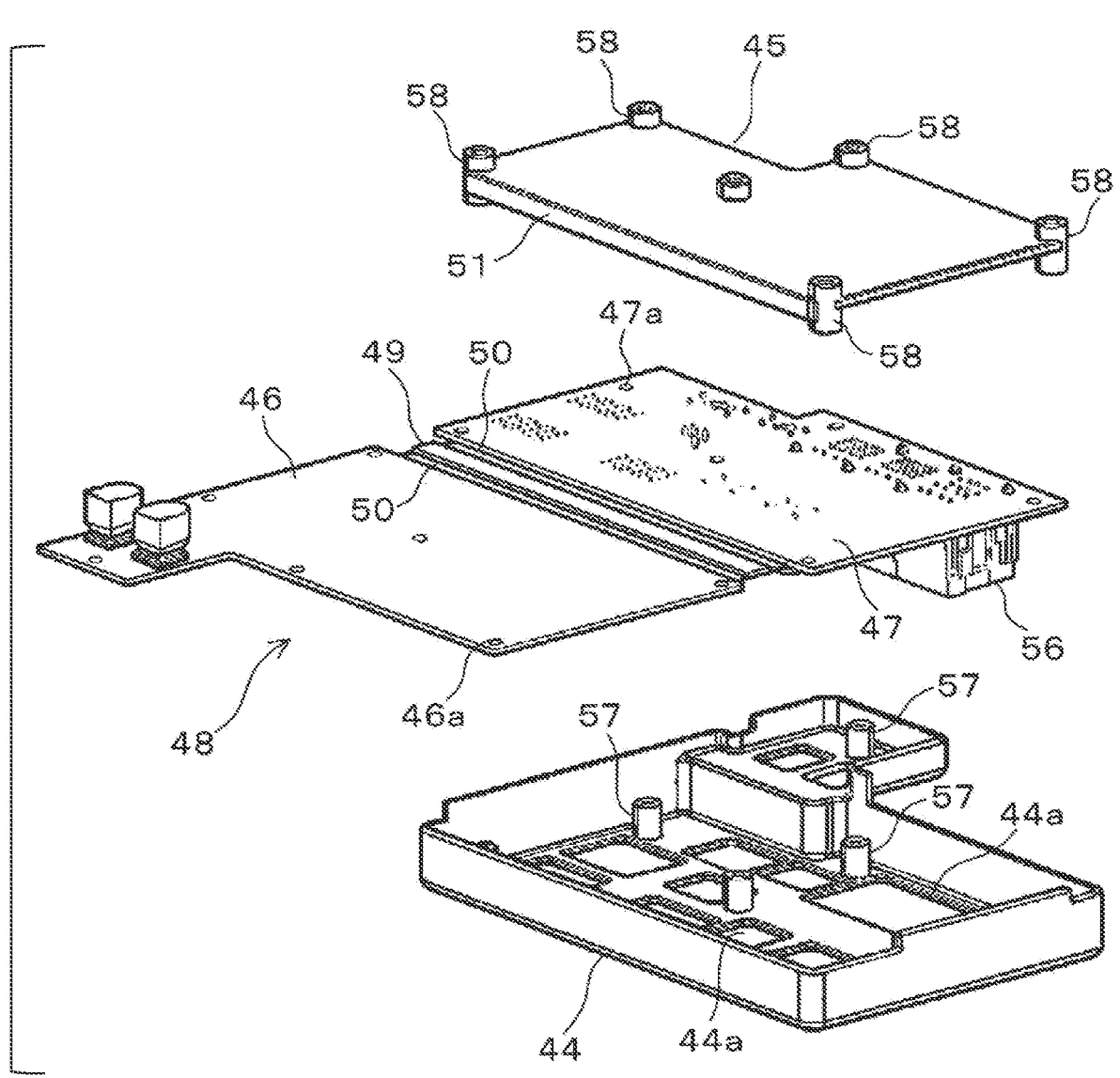
FIG. 15 is a perspective view illustrating an assembly procedure of the electronic device.

More specifically, as shown in FIG. 15, the rigid flexible substrate 48 has a joint substrate 49 between the CPU substrate 46 and the power supply substrate 47. The CPU substrate 46 and the joint substrate 49 are connected to each other by a flexible wiring substrate 50. The power supply substrate 47 and the joint substrate 49 are connected to each other by another flexible wiring substrate 50. As shown in FIG. 14, a mounting seat 51 is integrally provided on a side portion, in this case, the front side of the intermediate frame 45. The joint substrate 49 is attached to cover the mounting seat 51.

Figure 20:
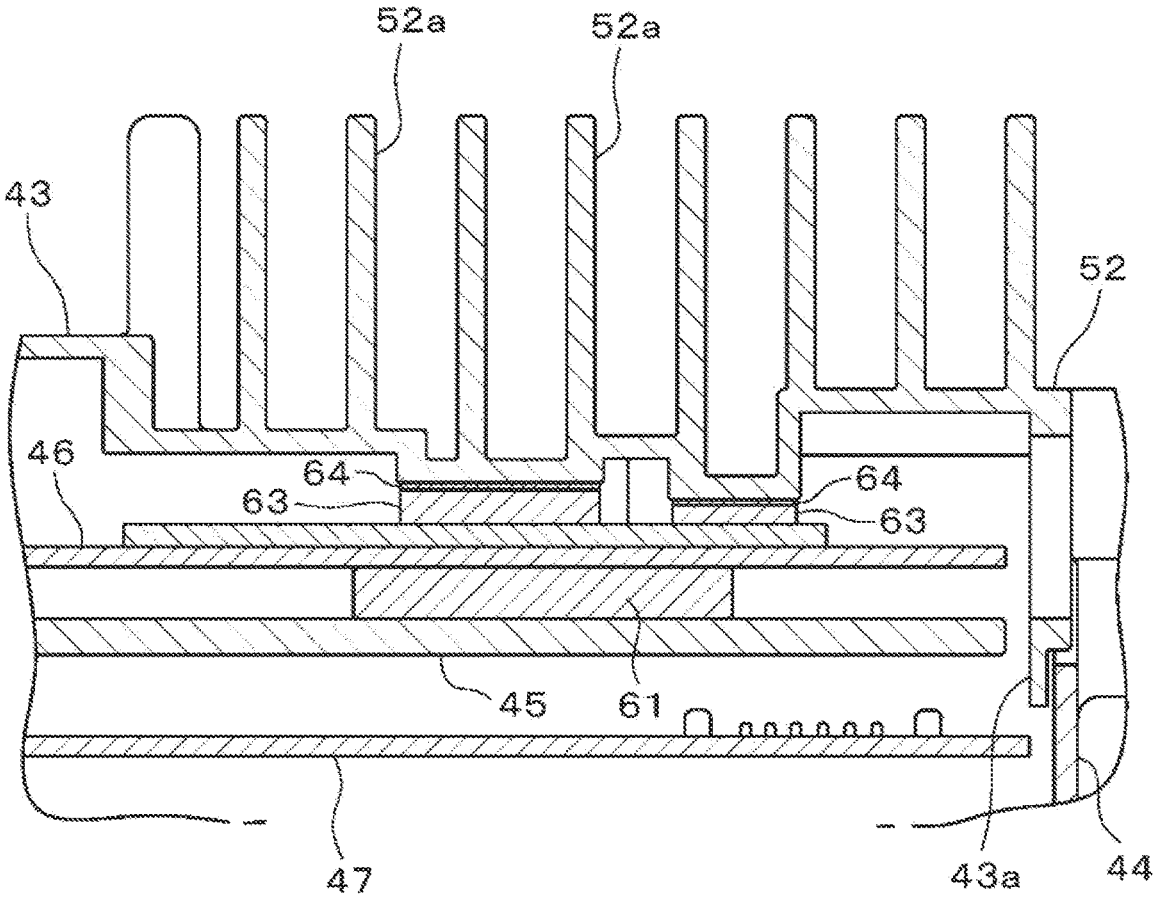
FIG. 20 is an enlarged view of the electronic device.
Figure 22:
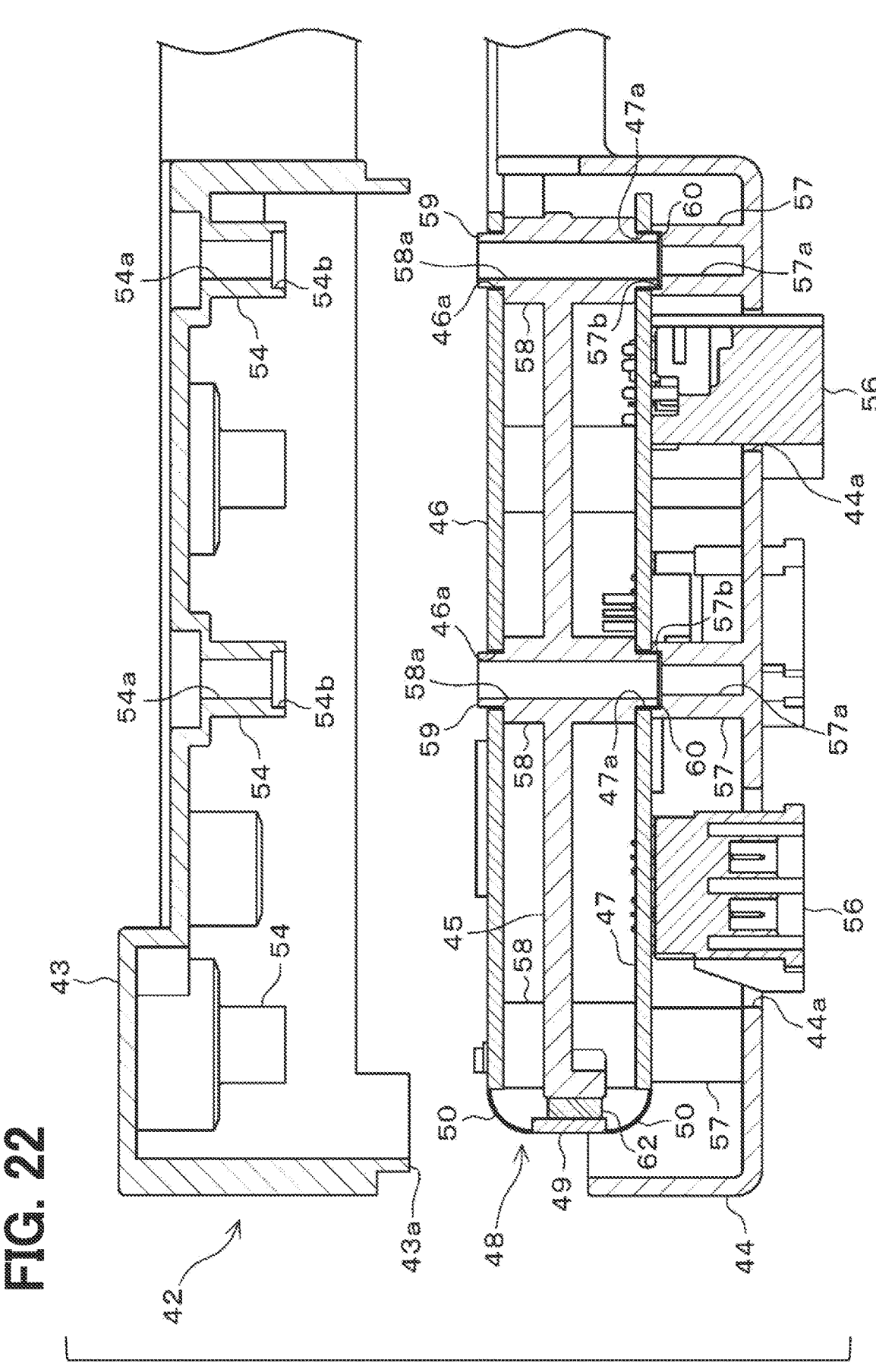
FIG. 22 is a sectional view illustrating a positioning state of the intermediate frame and the upper case.
Figure 23:
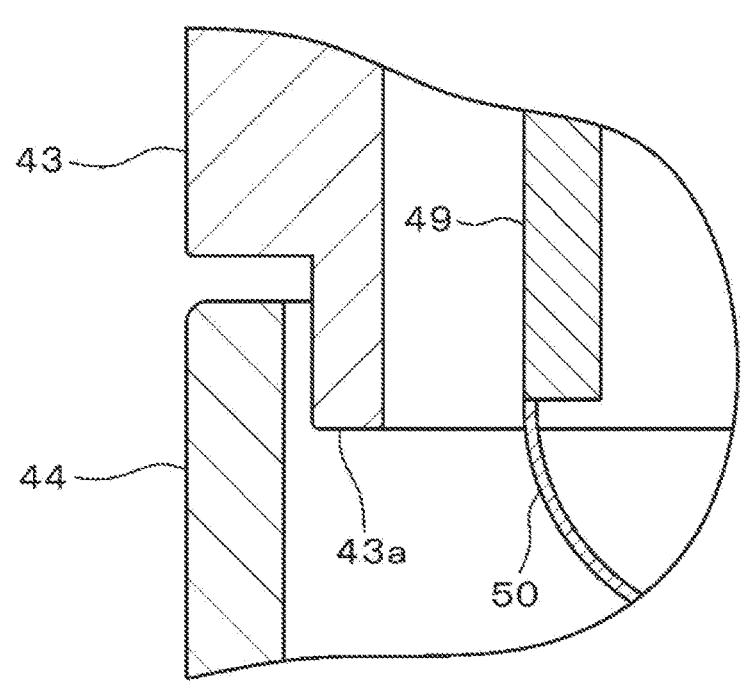
FIG. 23 is an enlarged sectional view illustrating a state in which the upper case and the bottom case are fitted to each other.

The upper case 43 has, as a whole, a lid shape, that is, a thin substantially rectangular box shape with an opened lower surface. A heat sink 52 having plural heat dissipation fins 52*a* extending in the left-right direction is integrally provided in a rectangular region of a substantially right half portion of the upper surface. As shown in FIG. 20, the bottom surface of the heat sink 52 is in contact with the electronic component 63 on the CPU substrate 46 via the heat dissipation gel 64. A cooling fan device 53 for supplying cooling air to the heat sink 52 is attached to the left side of the upper surface of the upper case 43. Although not shown in detail, the cooling fan device 53 includes a centrifugal fan device and a motor in a fan device casing 53*a*. As shown in FIGS. 22 and 23, the lower end of the upper case 43 integrally has a guide rib 43*a* fitted to the inner side of the upper end of the bottom case 44.

Figure 21:
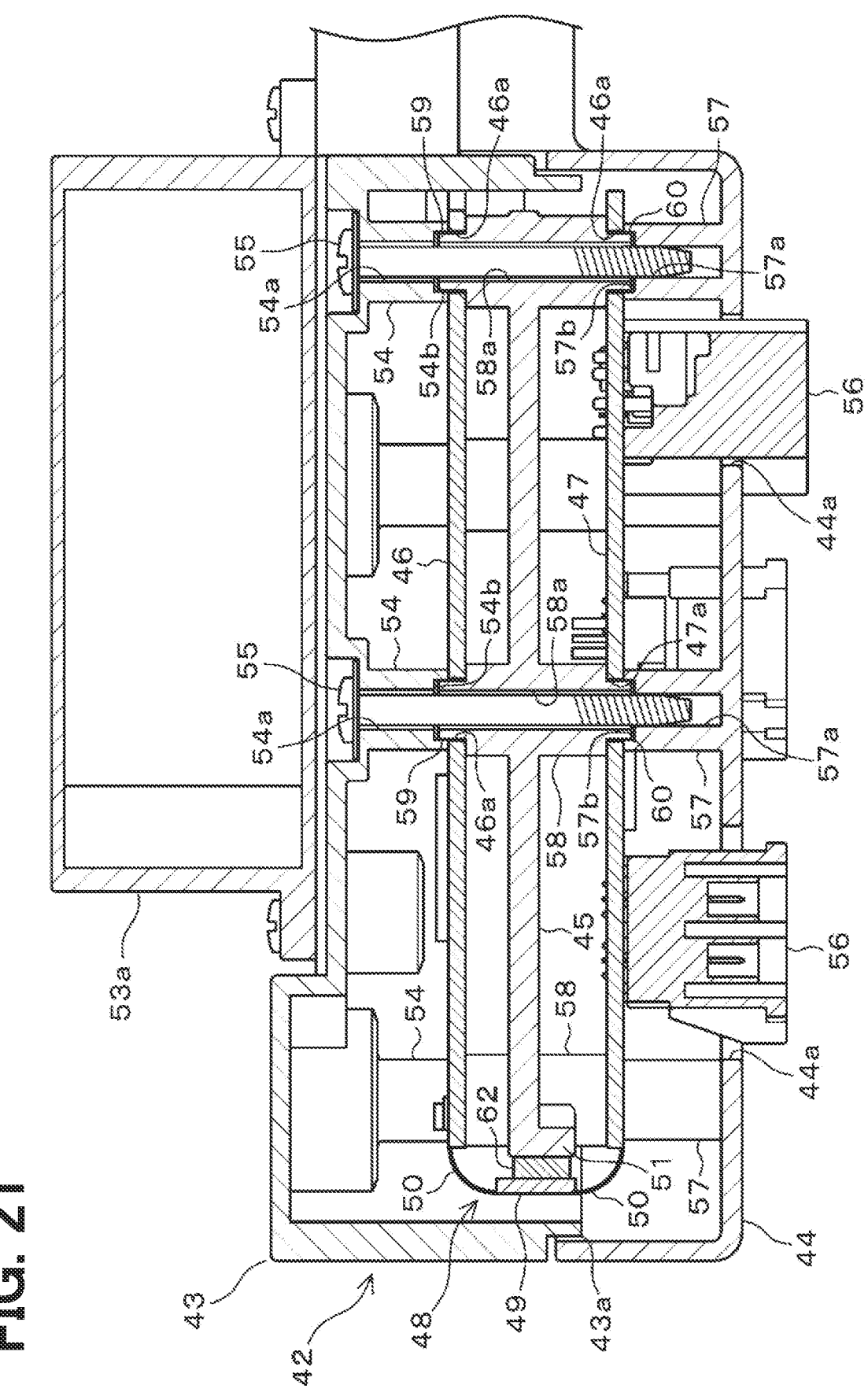
FIG. 21 is a view of the electronic device.

As shown in FIGS. 21 and 22, the lower surface of the upper case 43 integrally has cylindrical boss portions 54 protruding downward at positions, for example, at a total of six positions of three rows in the lateral direction and two rows in the front-rear direction. The boss portion 54 has a screw insertion hole 54*a* through which the long screw 55 as collective fastener passes in the up-down direction. A lower end of the boss portion 54 has a fitting recess 54*b* for positioning relative to the intermediate frame 45, which will be described later.

Figure 19:
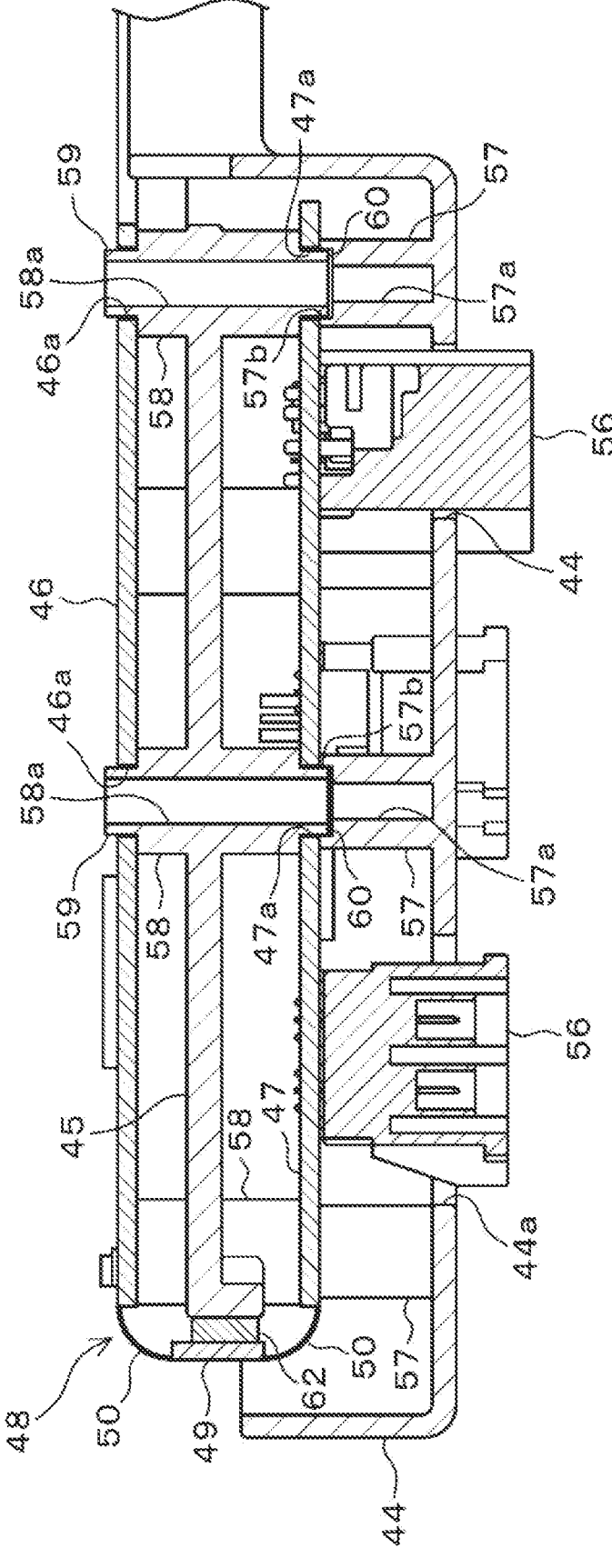
FIG. 19 is a sectional view illustrating an assembled state of a rigid flexible substrate.

As shown in FIG. 14, the bottom case 44 has a thin container shape as a whole, that is, a thin substantially rectangular box shape with an opened upper surface. The bottom plate of the bottom case 44 has plural openings 44*a* for connecting an external cable to a connector 56 mounted on the lower surface of the power supply substrate 47. As shown in FIGS. 19, the upper surface of the bottom plate of the bottom case 44 integrally has cylindrical boss portions 57 protruding upward at positions corresponding to the boss portions 54. An upper end of the boss portion 57 has a screw hole 57*a* to which the long screw 55 is fastened, and a fitting recess 57*b* for positioning relative to the intermediate frame 45.

The intermediate frame 45 has a substantially rectangular plate shape and integrally includes a cylindrical boss portion 58 extending in the up-down direction from the plate surface. The boss portion 58 is provided at six positions corresponding to the boss portions 54 and the boss portions 57, and has a screw insertion hole 58*a* penetrating through the boss portion in the up-down direction. The upper end of the boss portion 58 integrally has an upper fitting protrusion 59 serving as an upper fitting into which the CPU substrate 46 serving as an upper substrate is fitted and into which the fitting recess 54*b* of the boss portion 54 of the upper case 43 is fitted.

The lower end of the boss portion 58 integrally has a lower fitting protrusion 60 serving as a lower fitting into which the power supply substrate 47 is fitted and into which the fitting recess 57*b* of the boss portion 57 of the bottom case 44 is fitted. Thus, the boss portion 58 of the intermediate frame 45 functions as a positioning portion that positions the CPU substrate 46 and the power supply substrate 47 in the up-down direction and the lateral direction. As shown in FIG. 20, the intermediate frame 45 is in contact with the bottom surface of the CPU substrate 46 via the heat dissipation gel 61, so as to function as a heat sink. As described above, the mounting seat 51 is integrally provided on the front side of the intermediate frame 45.

The rigid flexible substrate 48 has the following configuration. As shown in FIGS. 14 to 17, in the rigid flexible substrate 48, a front side of the power supply substrate 47 having a rectangular plate shape is connected to the joint substrate 49, which is long in the lateral direction, via a flexible wiring substrate 50. The front side of the joint substrate 49 is connected to the rear side of the CPU substrate 46 having a rectangular plate shape via another flexible wiring substrate 50. In this case, the CPU substrate 46 is connected in a state where the front and rear sides are reversed and the upper and lower sides are reversed from the final assembled state. The flexible wiring substrate 50 is freely bendable while maintaining electrical connection between the substrates.

Although not shown in detail, electronic components constituting a power supply circuit are mounted on the power supply substrate 47, and the connector 56 is mounted on the lower surface. As shown in FIG. 21, the power supply substrate 47 has fitting holes 47*a* to be fitted to the lower fitting protrusions 60 at six positions corresponding to the boss portions 58. An electronic component 63 such as a CPU constituting a control circuit is mounted on an upper surface of the CPU substrate 46, that is, a surface facing downward in FIGS. 14 and 15. As shown in FIG. 22, the CPU substrate 46 has fitting holes 46*a* to be fitted to the upper fitting protrusions 59 at six positions corresponding to the boss portions 58.

As shown in FIG. 19, in the rigid flexible substrate 48, the joint substrate 49 is bent upward by 90 degrees in a state where the power supply substrate 47 is placed on the upper surface of the bottom case 44. Further, the CPU substrate 46 is bent rearward by 90 degrees with the intermediate frame 45 interposed therebetween. Thus, the power supply substrate 47 is disposed below the intermediate frame 45, and the CPU substrate 46 is disposed above the intermediate frame 45. As shown in FIG. 19, the joint substrate 49 is disposed immediately in front of the mounting seat 51, and is fixed to the front surface of the mounting seat 51 with a double-sided tape 62 having cushioning properties, thereby providing a fixing structure.

Next, an assembly procedure of the electronic device 41 will be described with reference to FIGS. 15 to 23, in which the rigid flexible substrate 48 is assembled in the housing 42. In assembling the electronic device 41, as shown in FIG. 15, the power supply substrate 47 of the rigid flexible substrate 48 is placed on the boss portion 57 of the bottom case 44. In this state, the intermediate frame 45 is placed on the power supply substrate 47. At this time, the lower fitting protrusion 60 of the lower end of each boss portion 58 of the intermediate frame 45 is fitted into the fitting recess 57*b* of the boss portion 57 of the bottom case 44 in a state of passing through the fitting hole 47*a* of the power supply substrate 47, that is, in a state of sandwiching the power supply substrate 47. Accordingly, as shown in FIG. 19, the power supply substrate 47 and the intermediate frame 45 are positioned with respect to the bottom case 44 in the up-down direction and the lateral direction.

Figure 16:
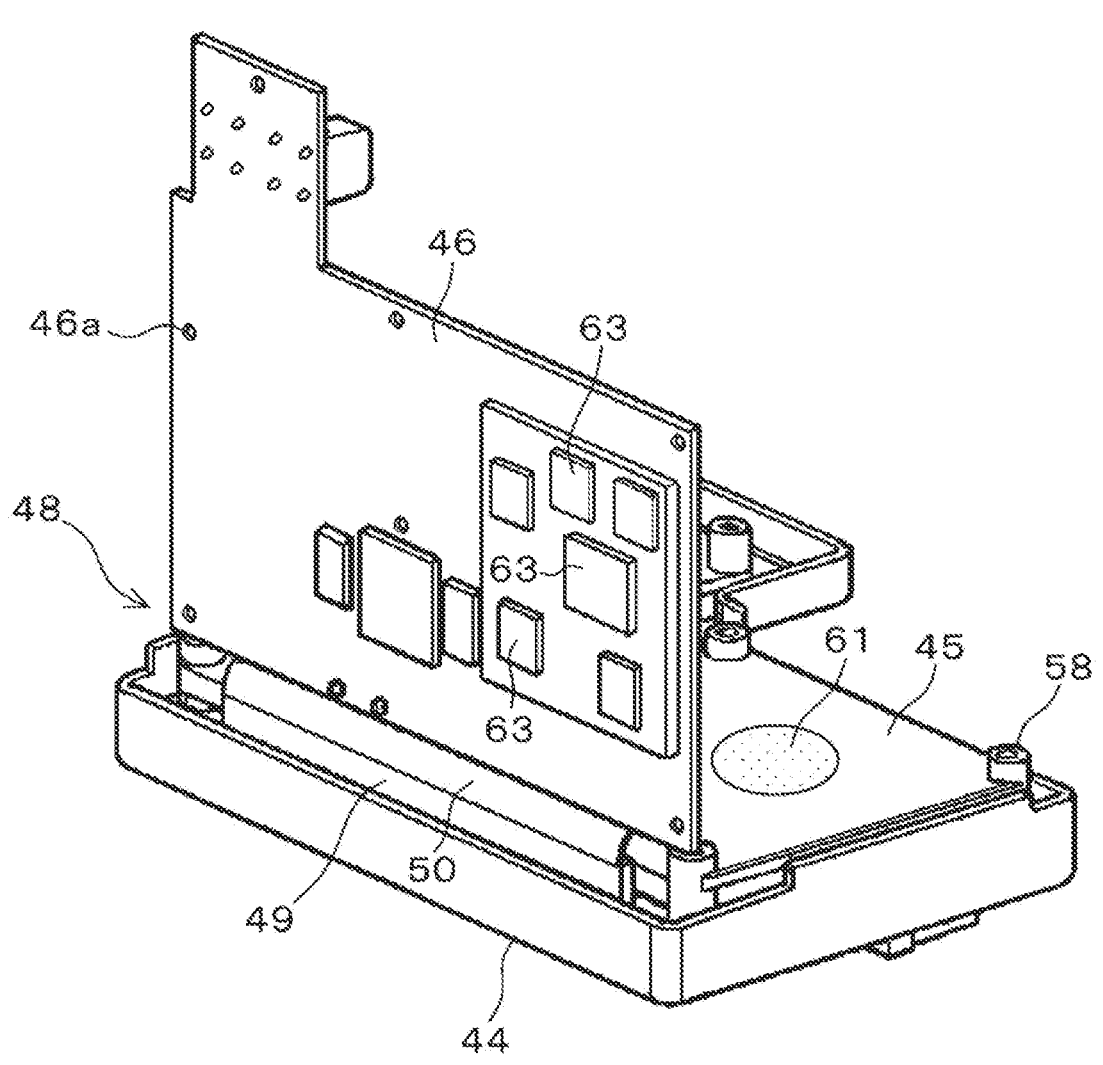
FIG. 16 is a perspective view illustrating an assembly procedure of the electronic device.

Next, from the above state, as shown in FIG. 16, the joint substrate 49 and the CPU substrate 46 of the rigid flexible substrate 48 are bent upward at a right angle from the front side of the power supply substrate 47. At this time, as shown in FIG. 19, the rear surface of the joint substrate 49 faces the front surface of the mounting seat 51 with a slight gap, and the joint substrate 49 is fixed to the mounting seat 51 with the double-sided tape 62. As shown in FIG. 16, a heat dissipation gel 61 is applied to a part of the upper surface of the intermediate frame 45 corresponding to the heat dissipation region of the electronic component 14 of the CPU substrate 46.

Figure 17:
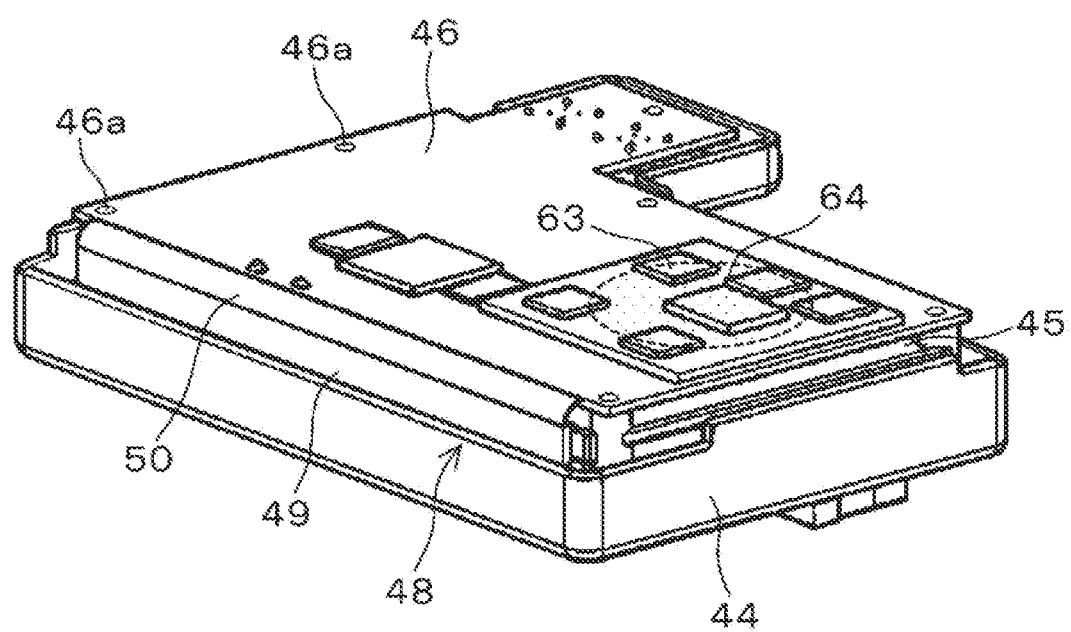
FIG. 17 is a perspective view illustrating an assembly procedure of the electronic device.

Next, as shown in FIG. 17, the CPU substrate 46 is bent rearward at a right angle from the upper side of the joint substrate 49. At this time, as shown in FIG. 19, the fitting hole 46*a* of the CPU substrate 46 is fitted to the upper fitting protrusion 59 of the upper end of each boss portion 58 of the intermediate frame 45. Accordingly, the CPU substrate 46 is positioned in the up-down direction and the lateral direction with respect to the intermediate frame 45. In this state, as shown in FIG. 20, the heat dissipation gel 61 is in contact with the lower surface of the CPU substrate 46, and the intermediate frame 45 and the CPU substrate 46 are in thermal contact with each other. As shown in FIG. 17, the heat dissipation gel 64 is applied to the upper surface of the CPU substrate 46, corresponding to the upper surface of the electronic component 63.

Figure 18:
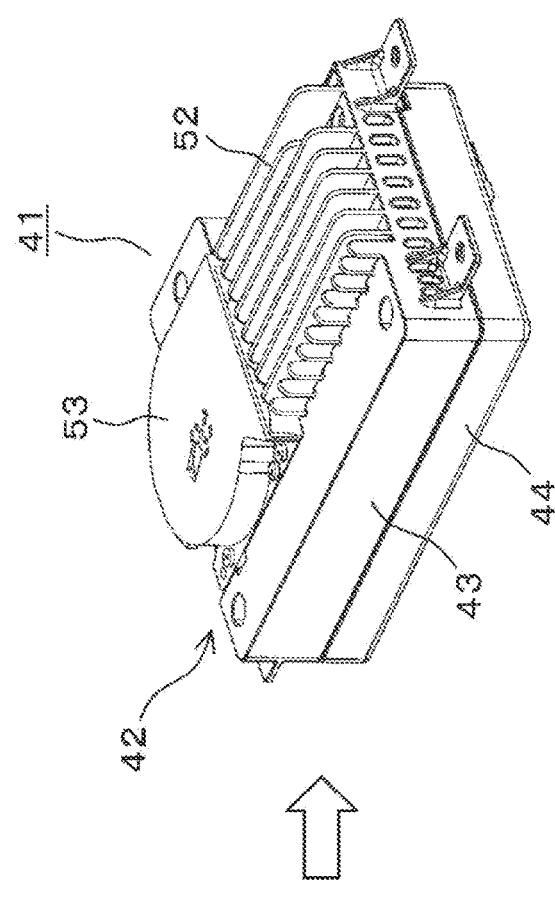
FIG. 18 is a perspective view illustrating an assembly procedure of the electronic device.
Figure 18:
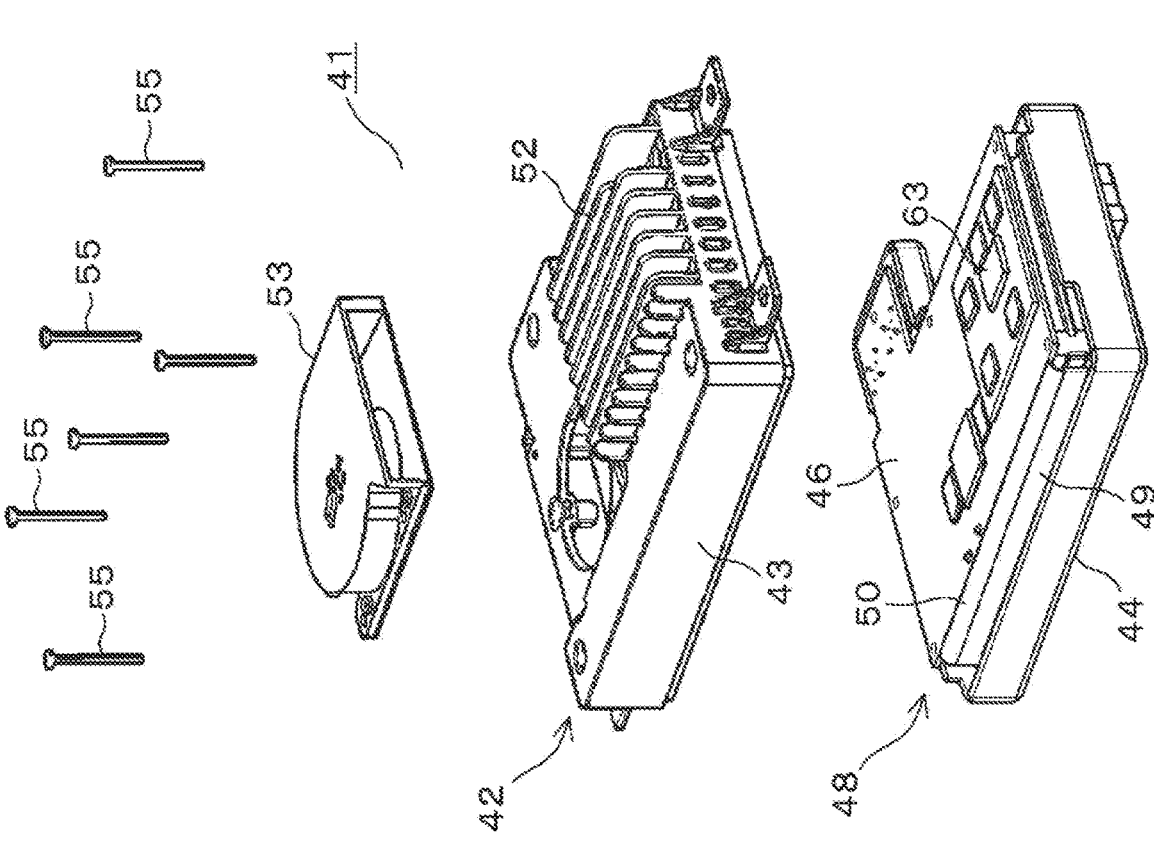

Thereafter, as shown in FIG. 18, the upper case 43 is disposed so as to cover the upper portion of the CPU substrate 46. At this time, as shown in FIG. 21, the fitting recess 54*b* of the boss portion 54 on the bottom surface of the upper case 43 is fitted to the upper fitting protrusion 59 of the upper end of the boss portion 58 of the intermediate frame 45 in a state where the CPU substrate 46 is sandwiched therebetween. As a result, positioning in the up-down direction and the lateral direction is achieved. As shown in FIG. 23, in this state, the guide rib 43*a* of the lower end of the upper case 43 is fitted with the upper end of the bottom case 44. As shown in FIG. 20, the upper surface of the electronic component 63 is thermally connected to the heat sink 52 of the upper case 3 via the heat dissipation gel 64.

In a state where the upper case 43 is fitted with the bottom case 44, as shown in FIG. 21, the screw insertion hole 54a of the boss portion 54 of the upper case 43, the screw insertion hole 58a of the boss portion 58 of the intermediate frame 45, and the screw hole 57a of the boss portion 57 of the bottom case 44 are arranged so as to be continuous in a straight line in the up-down direction. As shown in FIG. 18, the long screws 55 are respectively inserted into the screw insertion holes 54a of the upper case 43 from the upper side. Further, the long screw 55 is made to pass through the screw insertion hole 58a of the boss portion 58 of the intermediate frame 45 and is fastened to the screw hole 57a of the bottom case 44. Thus, the upper case 43, the CPU substrate 46, the intermediate frame 45, the power supply substrate 47, and the bottom case 44 are integrally connected by the long screw 55. Thereafter, the cooling fan device 53 is attached to the upper surface of the upper case 3, and thus the electronic device 41 is obtained.

According to the electronic device 41 of the third embodiment, the upper case 43, the CPU substrate 46, the intermediate frame 45, the power supply substrate 47, and the bottom case 44 are collectively fastened by the long screw 55 as in the first embodiment. As a result, it is possible to obtain an excellent effect that the configuration can be simplified and the assemblability can be improved when the substrates are in the housing 42. The CPU substrate 46, the power supply substrate 47, the upper case 43 and the bottom case 44 can be positioned in the up-down direction and the lateral direction by the boss portion 58 of the intermediate frame 45. Thus, the entire positioning can be performed. As a result, the number of positioning portions and the overall configuration can be simplified.

Also in the present embodiment, the cooling air passes through the heat dissipation fins 52a of the heat sink 52 to exchange heat by driving the cooling fan device 53, so as to contribute to heat dissipation from the CPU substrate 46 and cooling of the electronic component 63. Heat can be emitted from the intermediate frame 45 that functions as a heat sink, such that the heat dissipation effect can be enhanced. In this case, it is easy to manage the dimension of the gap between the electronic component 63 on the CPU substrate 46 and the heat sink 52 and the dimension of the gap between the lower surface of the CPU substrate 46 and the intermediate frame 45. Accordingly, the thickness of the heat dissipation gel 64 and the heat dissipation gel 61 can be sufficiently reduced, and the thermal resistance can be reduced.

In the present embodiment, the CPU substrate 46 and the power supply substrate 47 are assembled in the housing 42 using the rigid flexible substrate 48 in which the CPU substrate 46 serving as the upper substrate and the power supply substrate 47 serving as the lower substrate are integrally connected to each other. Accordingly, since the CPU substrate 46 and the power supply substrate 47 are integrated with each other, it is possible to further facilitate the assembly while maintaining the function of the spacer or the like of the intermediate frame 45. Since the joint substrate 49 of the rigid flexible substrate 48 is fixed to the mounting seat 51 of the intermediate frame 45 by the double-sided tape 62, it is possible to suppress vibration of the substrates 46 and 47 caused by vibration of a vehicle during use. As a result, it is possible to obtain an effect of restricting breakage or disconnection.

Fourth Embodiment

Figure 24:
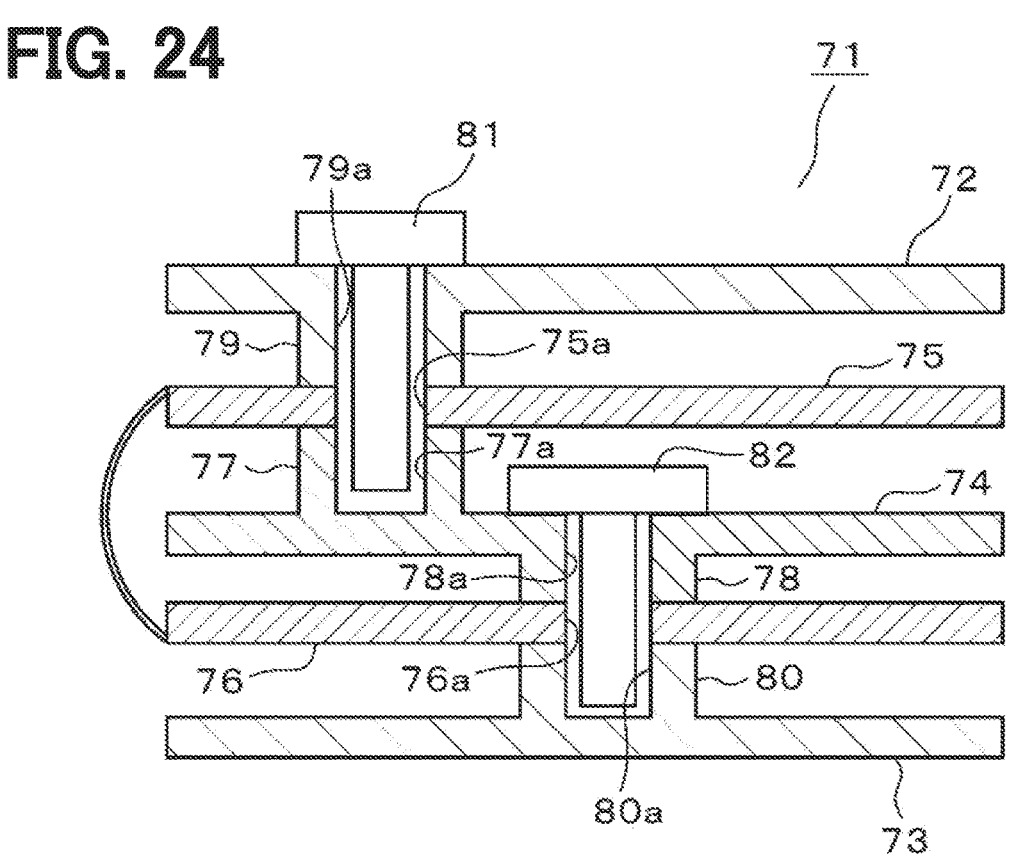
FIG. 24 is an enlarged sectional view illustrating an electronic device according to a fourth embodiment.

FIG. 24 schematically illustrates an electronic device 71 according to a fourth embodiment. The fourth embodiment differs from the first embodiment in the entire fastening structure. The intermediate frame 74 is provided between the upper case 72 and the bottom case 73. The upper substrate 75 is provided above the intermediate frame 74, and the lower substrate 76 is provided below the intermediate frame 74.

The intermediate frame 74 integrally has the first boss portions 77 (only one of them is shown in FIG. 24) located at plural positions on the upper surface to protrude upward. The second boss portions 78 (only one of them is shown in FIG. 24) are located at plural positions different from the first boss portion 77 on the lower surface of the intermediate frame 74, so as to protrude downward. A screw hole 77a having an open upper surface is formed in the first boss portion 77, and a screw insertion hole 78a penetrating in the up-down direction is formed in the second boss portion 78. The first boss portion 77 and the second boss portion 78 also function as positioning portion for positioning the upper substrate 75 and the lower substrate 76 in the up-down direction and the lateral direction.

A screw insertion hole 75a is formed in the upper substrate 75 at position corresponding to the first boss portion 77. The upper case 72 integrally has a boss portion 79 protruding downward at position corresponding to the first boss portion 77, and a screw insertion hole 79a penetrating in the up-down direction is formed in the boss portion 79. A screw insertion hole 76a is formed in the lower substrate 76 at position corresponding to the second boss portion 78. The bottom case 73 integrally has a boss portion 80 protruding upward at position corresponding to the second boss portion 78, and a screw hole 80a is opened on the upper and lower surfaces of the boss portion 80.

In the electronic device 71, the lower substrate 76 is placed on the bottom case 73, and the intermediate frame 74 is placed on the lower substrate 76. At this time, the screw insertion hole 78a of the second boss portion 78 of the intermediate frame 74, the screw insertion hole 76a of the lower substrate 76, and the screw hole 80a of the boss portion 80 of the bottom case 73 are positioned so as to be vertically continuous in a straight line. In this state, the second screw 82 as the second fastener is passed through the screw insertion hole 78a and the screw insertion hole 76a in this order from the upper side of the intermediate frame 74, and is fastened to the screw hole 80a. Thus, the intermediate frame 74, the lower substrate 76, and the bottom case 73 are integrally connected by the second screw 82.

Thereafter, the upper substrate 75 is placed on the intermediate frame 74, and the upper case 72 is placed on the upper substrate 75. At this time, the screw insertion hole 79a of the boss portion 79 of the upper case 72, the screw insertion hole 75a of the upper substrate 75, and the screw hole 77a of the first boss portion 77 of the intermediate frame 74 are positioned so as to be vertically and linearly continuous. In this state, the first screw 81 as the first fastener is passed through the screw insertion hole 79a and the screw insertion hole 75a in this order from the upper side of the upper case 72, and is tightened to the screw hole 77a. Accordingly, the upper case 72, the upper substrate 75, and the intermediate frame 74 are integrally connected by the first screw 81. Thus, the substrates are entirely connected by the first screw 81 and the second screw 82 so as to be interposed around the intermediate frame 74.

According to the fourth embodiment, since the substrates can entirety be assembled by the first screw 81 and the second screw 82, it is possible to reduce the number of fasteners and the like as compared with a case where individual components are respectively attached by screwing. As a result, the number of assembly steps can be relatively reduced, and the configuration is relatively simplified, leading to miniaturization. As a result, according to the present embodiment, it is possible to achieve an effect of simplifying the configuration and improving the assemblability when the substrates are housed in the housing.

Fifth Embodiment

Figure 25:
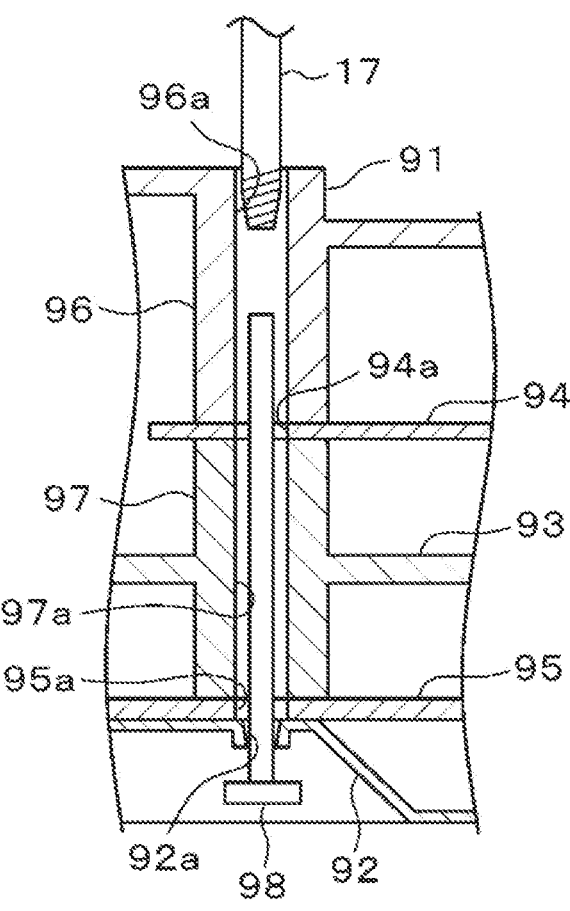
FIG. 25 is an enlarged sectional view illustrating an electronic device according to a fifth embodiment.

FIG. 25 illustrates a fifth embodiment, which is different from the first embodiment in that the housing of the electronic device includes an upper case 91 and a bottom case 92 made of aluminum die-casting, and an intermediate frame 93 made of aluminum die-casting. An upper substrate 94 and a lower substrate 95 are respectively provided above and below the intermediate frame 93.

The upper case 91 has a boss portion 96 protruding downward, and the boss portion 96 has a screw insertion hole 96a passing through in the up-down direction, through which the long screw 17 is inserted. The lower surface of the boss portion 96 is a flat surface. A screw hole 92a to which the long screw 17 is fastened is formed in the bottom case 92. The intermediate frame 93 integrally includes a cylindrical boss portion 97 as a positioning portion extending in the up-down direction from the main plate. The boss portion 97 has a screw insertion hole 97a penetrating vertically. The upper and lower end surfaces of the boss portion 97 are flat surfaces. A fitting hole 94a is formed in the upper substrate 94, and a fitting hole 95a is formed in the lower substrate 95.

In the present embodiment, the lower substrate 95 is placed on the bottom case 92 such that the fitting hole 95a overlaps the screw hole 92a, and the intermediate frame 93 is placed on the lower substrate 95 such that the screw insertion hole 97a of the boss portion 97 overlaps the fitting hole 95a. Next, the upper substrate 94 is placed on the boss portion 97 of the intermediate frame 93 so that the fitting hole 94a overlaps with the screw insertion hole 97a, and the upper case 91 is placed on the upper substrate 94 so that the screw insertion hole 96a of the boss portion 96 overlaps with the fitting hole 94a. Thus, the upper substrate 94 and the lower substrate 95 are positioned in the up-down direction by the boss portion 97 of the intermediate frame 93.

A positioning pin 98 is used as a jig for positioning the upper substrate 94 and the lower substrate 95 in the lateral direction with respect to the intermediate frame 93. In this case, the positioning pin 98 is inserted into the screw hole 92a, the fitting hole 95a of the lower substrate 95, the screw insertion hole 97a of the boss portion 97 of the intermediate frame 93, the fitting hole 94a of the upper substrate 94, and the screw insertion hole 96a of the boss portion 92 of the upper case 91 in this order from the lower side of the bottom case 96. Thereby, the positioning in the lateral direction is performed. After that, the positioning pin 98 is pulled out, and then collective connection is performed by the long screw 17. According to the fifth embodiment, it is possible to simplify the configuration and improve the assemblability.

Sixth Embodiment

Figure 26:
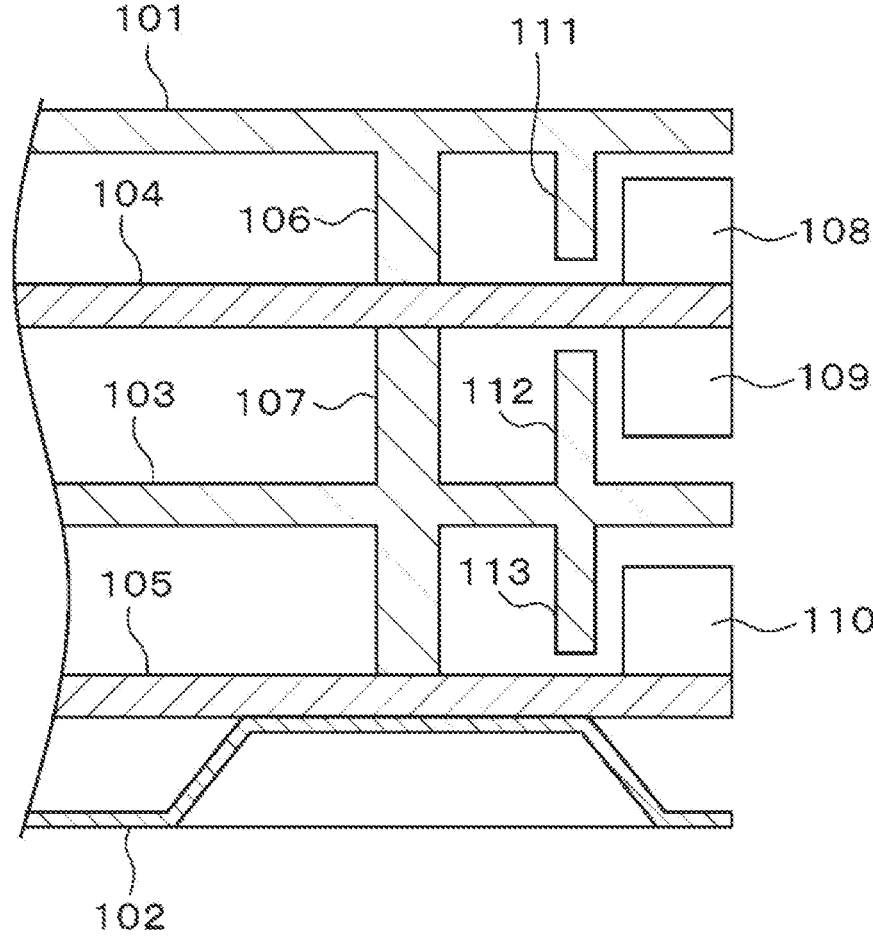
FIG. 26 is an enlarged sectional view illustrating an electronic device according to a sixth embodiment.

FIG. 26 shows a sixth embodiment, in which the intermediate frame 103 is provided in the housing including the upper case 101 and the bottom case 102, and the upper substrate 104 and the lower substrate 105 are respectively provided above and below the intermediate frame 103. The upper case 101 integrally has a downward boss portion 106. The intermediate frame 103 integrally has a boss portion 107 serving as a positioning portion that performs positioning in the up-down direction and the lateral direction.

The rear side of the upper substrate 104 has an upper connector 108 for external connection on the upper surface, and an intermediate connector 109 for external connection on the lower surface. A lower connector 110 for external connection is provided on the rear side of the upper surface of the lower substrate 105. The upper case 101 integrally has an upper shield portion 111 for shielding the upper connector 108 from noise. The intermediate frame 103 integrally has an intermediate shield portion 112 for shielding the intermediate connector 109 from noise. The intermediate frame 103 integrally has a lower shield portion 113 for shielding the lower connector 110 from noise.

According to the sixth embodiment, the upper shield portion 111 that covers the upper connector 108 of the upper substrate 104 to shield noise is integrally provided in the upper case 101. In addition, the intermediate frame 103 integrally has the intermediate shield portion 112 that covers the intermediate connector 109 of the upper substrate 104 to shield noise and the lower shield portion 113 that covers the lower connector 110 of the lower substrate 105 to shield noise. Accordingly, a configuration for shielding noise with respect to each of the connectors 108, 109, and 110 for external connection is not separately provided, and a simple configuration can be used, and an assembling operation can be facilitated. Note that not all of the connectors 108, 109, and 110 may be provided. One or two of the connectors is provided and a shield portion is provided for the one or two of the connectors.

Seventh Embodiment

Figure 27:
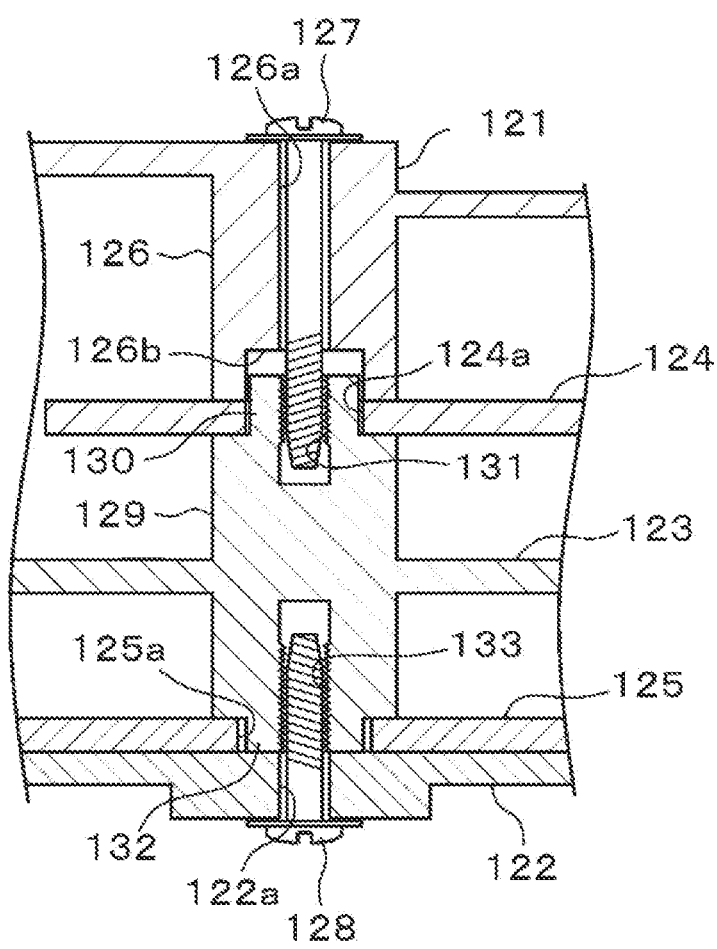
FIG. 27 is an enlarged sectional view illustrating an electronic device according to a seventh embodiment.

FIG. 27 shows a seventh embodiment different from the first embodiment in that the housing of the electronic device includes an upper case 121 and a bottom case 122 made of aluminum die-casting, and an intermediate frame 123 made of aluminum die-casting is provided therein. An upper substrate 124 and a lower substrate 125 are respectively provided above and below the intermediate frame 123.

The upper case 121 has a boss portion 126 protruding downward, and the boss portion 126 has a screw insertion hole 126a through which a first screw 127 as a first fastener is inserted. A fitting recess 126b is formed in the lower end of the boss portion 126. A screw insertion hole 122a through which a second screw 128 as a second fastener is inserted is formed in the bottom case 122. A fitting hole 124a is formed in the upper substrate 124, and a fitting hole 125a is formed in the lower substrate 125.

The intermediate frame 123 integrally includes a cylindrical boss portion 129 as a positioning portion extending in the up-down direction from the main plate. An upper fitting protrusion 130 serving as an upper fitting to which the upper substrate 124 is fitted is integrally formed at an upper end of the boss portion 129. In addition, the boss portion 129 has a first screw hole 131 that opens at the upper end surface. A lower fitting protrusion 132 serving as a lower fitting to which the lower substrate 125 is fitted is integrally formed at a lower end of the boss portion 129. The boss portion 129 has a second screw hole 133 that opens at the lower end surface.

In the present embodiment, the lower substrate 125 is placed on the bottom case 122 such that the fitting hole 125a overlaps with the screw insertion hole 122a, and the intermediate frame 123 is placed on the lower substrate 125 such that the lower fitting protrusion 132 of the boss portion 129 is fitted into the fitting hole 125a. Next, the upper substrate 124 is placed on the boss portion 129 of the intermediate frame 123 so that the fitting hole 124a is fitted to the upper fitting protrusion 130. Further, the upper case 121 is placed on the upper substrate 124 so that the fitting recess 126b of the boss portion 126 is fitted to the upper fitting protrusion 130. Thus, the upper substrate 124 and the lower substrate 125 are positioned in the up-down direction and the lateral direction by the boss portion 129 of the intermediate frame 123.

The first screw 127 is fastened to the first screw hole 131 of the boss portion 129 from the upper side through the screw insertion hole 126a of the upper case 121. Accordingly, the upper case 121, the upper substrate 124, and the intermediate frame 123 are integrally connected by the first screw 127. At the same time, the second screw 128 is fastened to the second screw hole 133 of the boss portion 129 from the lower side through the screw insertion hole 122a of the bottom case 122. Thus, the bottom case 122, the lower substrate 125, and the intermediate frame 123 are integrally connected by the second screw 128.

Thus, the substrates are connected by the first screw 127 and the second screw 128 so as to be interposed around the intermediate frame 123. According to the seventh embodiment, since the substrates can be entirety assembled by the first screw 127 and the second screw 128, it is possible to reduce the number of fasteners and the like as compared with a case where individual components are respectively attached by screwing. As a result, the number of assembly steps can be relatively reduced, and the configuration is relatively simplified, leading to miniaturization. As a result, according to the seventh embodiment, it is possible to obtain an effect that the configuration can be simplified and the assemblability can be improved when the substrates are housed in the housing.

Eighth Embodiment

Figure 28:
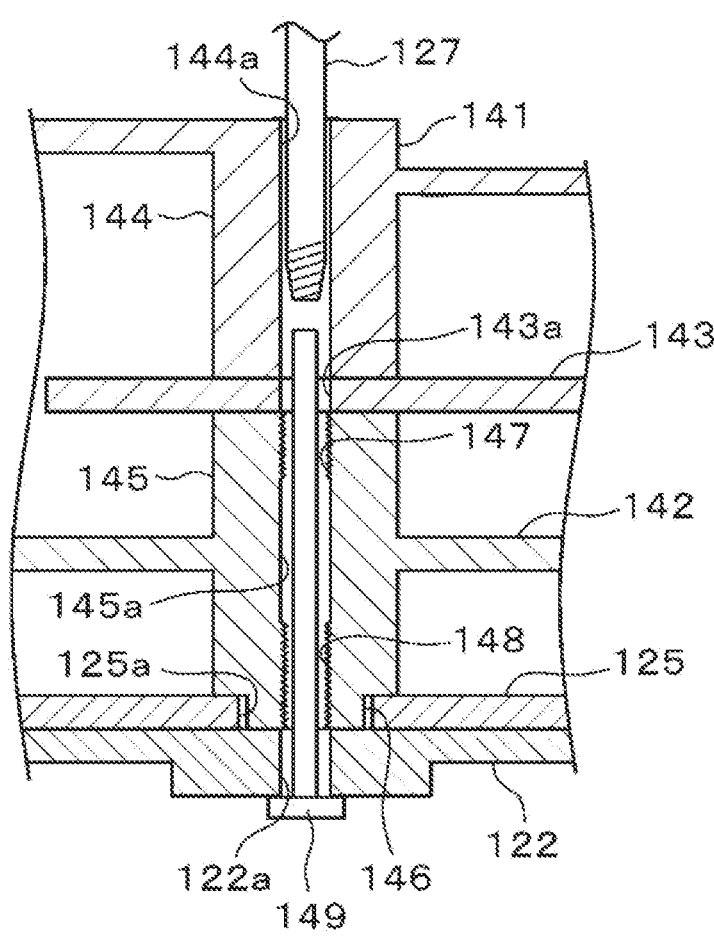
FIG. 28 is an enlarged sectional view illustrating an electronic device according to an eighth embodiment.

FIG. 28 illustrates the eighth embodiment different from the seventh embodiment in that the housing of the electronic device includes an upper case 141 and a bottom case 122 made of aluminum die-casting, and an intermediate frame 142 made of aluminum die-casting is provided therein. An upper substrate 143 and a lower substrate 125 are respectively provided above and below the intermediate frame 142.

The upper case 141 has a boss portion 144 protruding downward, and the boss portion 144 has a screw insertion hole 144a through which a first screw 127 as a first fastener is inserted. The lower surface of the boss portion 144 is a flat surface. The upper substrate 143 has a fitting hole 143a corresponding to the screw insertion hole 144a and having a size through which the first screw 127 is inserted.

The intermediate frame 142 integrally includes a cylindrical boss portion 145 as a positioning portion extending in the up-down direction from the main plate. The upper end surface of the boss portion 145 is a flat surface. A lower fitting protrusion 146 serving as a lower fitting to which the lower substrate 125 is fitted is integrally formed at a lower end of the boss portion 145. A through hole 145a penetrating vertically is formed in the boss portion 145. A first screw hole 147 is formed in an upper end of the through hole 145a, and a second screw hole 148 is formed in a lower end of the through hole 145a.

In the present embodiment, the lower substrate 125 is placed on the bottom case 122 such that the fitting hole 125a overlaps with the screw insertion hole 122a, and the intermediate frame 142 is placed on the lower substrate 125 such that the lower fitting protrusion 146 of the boss portion 145 is fitted into the fitting hole 125a. Thus, the lower substrate 125 is positioned in the up-down direction and the lateral direction by the boss portion 145 of the intermediate frame 142. Next, the upper substrate 143 is placed on the boss portion 145 of the intermediate frame 142 so that the fitting hole 143a overlaps the first screw hole 147. Further, the upper case 141 is placed on the upper substrate 143 such that the screw insertion hole 144a of the boss portion 144 overlaps the fitting hole 143a. Thus, the upper substrate 143 is positioned in the up-down direction by the boss portion 145 of the intermediate frame 142.

A positioning pin 149 is used as jig for positioning the upper substrate 143 in the lateral direction with respect to the intermediate frame 142. In this case, the positioning pin 149 is inserted into the screw insertion hole 122a, the fitting hole 125a of the lower substrate 125, the through hole 145a of the boss portion 145 of the intermediate frame 142, the fitting hole 143a of the upper substrate 143, and the screw insertion hole 144a of the boss portion 122 of the upper case 141 in this order from the lower side of the bottom case 144. Thereby, the positioning in the lateral direction is performed.

Thereafter, after the positioning pin 149 is pulled out, the first screw 127 is fastened to the first screw hole 147 of the boss portion 125 from the upper side through the screw insertion hole 144a of the upper case 141. Accordingly, the upper case 141, the upper substrate 143, and the intermediate frame 142 are integrally connected by the first screw 127. At the same time, the second screw 128 is fastened to the second screw hole 148 of the boss portion 145 from the lower side through the screw insertion hole 122a of the bottom case 122. Thus, the bottom case 122, the lower substrate 125, and the intermediate frame 142 are integrally connected by the second screw 128.

Thus, the substrates are connected by the first screw 127 and the second screw 128 so as to be interposed around the intermediate frame 142. According to the eighth embodiment, since the substrates can be entirety assembled by the first screw 127 and the second screw 128, it is possible to reduce the number of fasteners and the like as compared with a case where individual components are respectively attached by screwing. As a result, the number of assembly steps can be relatively reduced, and the configuration is relatively simplified, leading to miniaturization. As a result, according to the eighth embodiment, it is possible to obtain the effect of simplifying the configuration and improving the assemblability when the substrates are housed in the housing.

Although not described in detail in each of the embodiments, a power supply substrate, which is a lower substrate provided under the intermediate frame in the housing, can also be configured to sufficiently dissipate heat. In this case, for example, the power supply substrate or a component on the power supply substrate may be thermally connected to the heat sink of the intermediate frame to dissipate heat, or the power supply substrate may be thermally connected to the bottom case to dissipate heat from the bottom case. In addition, a cooling fan device for cooling the power supply substrate may be provided. Accordingly, the heat dissipation performance from the power supply substrate can be further improved.

In the first embodiment, the extension substrate 9 is provided as the upper substrate in addition to the CPU substrate 8. However, the number of the upper substrates may be one or three or more. Plural lower substrates can also be provided. In the first embodiment, the first cooling fan device 11 and the second cooling fan device 12 are provided.

However, only the second cooling fan device 12 may be provided, or three or more cooling fan devices may be provided. In the upper fitting and the lower fitting, the concavo-convex relationship of the fitting with the mating side may be reversed. In each of the embodiments, eight or six long screws 17, 35 are used, but the number of screws to be used can be appropriately changed. Further, the collective fastener is not limited to a long screw, and various fasteners such as a bolt and a nut, a rivet, and a clip can be adopted.

In each of the embodiments, the present disclosure is applied to an ECU for a vehicle. However, the present disclosure can be applied to various applications and electronic devices in general. It goes without saying that various changes can be made to the material of the housing, the overall shape, the arrangement of the electronic components and the connectors, and the like. While the present disclosure has been described with reference to embodiments thereof, it is to be understood that the disclosure is not limited to the embodiments and constructions. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

What is claimed is:

1. An electronic device comprising:
a housing; and
a substrate disposed in the housing, an electronic component being mounted on the substrate, wherein
the housing includes an upper case, a bottom case, and an intermediate frame positioned between the upper case and the bottom case,
the substrate includes an upper substrate above the intermediate frame and a lower substrate below the intermediate frame,
the intermediate frame includes a positioning portion that performs positioning in an up-down direction with respect to the upper substrate and the lower substrate,
the upper case, the upper substrate, the intermediate frame, the lower substrate, and the bottom case are integrally connected by a collective fastener,
the positioning portion performs positioning in a lateral direction with respect to the upper substrate and the lower substrate,
the positioning portion includes a plurality of boss portions provided to extend in the up-down direction from the intermediate frame,
an upper end of the boss portion has an upper fitting that fits with the upper substrate,
a lower end of the boss portion has a lower fitting that fits with the lower substrate,
the upper fitting is fitted to the upper case across the upper substrate,
the lower fitting is fitted to the bottom case across the lower substrate, and
the intermediate frame functions as a heat sink for dissipating heat from at least one of the upper substrate or the lower substrate,
the electronic device further comprising:
a heat dissipation fin provided on the intermediate frame; and
a fan device configured to supply cooling air to the heat dissipation fin.

2. The electronic device according to claim 1, wherein at least one of the upper substrate or the lower substrate is thermally connected to the intermediate frame.

3. The electronic device according to claim 1, wherein the upper substrate and the lower substrate are connected by an inter-substrate connector through a hole provided in the intermediate frame.

4. An electronic device comprising:
a housing; and
a substrate disposed in the housing, an electronic component being mounted on the substrate, wherein
the housing includes an upper case, a bottom case, and an intermediate frame positioned between the upper case and the bottom case,
the substrate includes an upper substrate above the intermediate frame and a lower substrate below the intermediate frame,
the intermediate frame includes a positioning portion that performs positioning in an up-down direction with respect to the upper substrate and the lower substrate,
the upper case, the upper substrate, the intermediate frame, the lower substrate, and the bottom case are integrally connected by a collective fastener,
the positioning portion performs positioning in a lateral direction with respect to the upper substrate and the lower substrate,
the positioning portion includes a plurality of boss portions provided to extend in the up-down direction from the intermediate frame,
an upper end of the boss portion has an upper fitting that fits with the upper substrate,
a lower end of the boss portion has a lower fitting that fits with the lower substrate,
the upper fitting is fitted to the upper case across the upper substrate, and
the lower fitting is fitted to the bottom case across the lower substrate,
the electronic device further comprising:
a connector provided on at least one of the upper substrate or the lower substrate for external connection; and
a shield portion provided on the intermediate frame to cover the connector so as to shield noise.

5. An electronic device comprising:
a housing; and
a substrate disposed in the housing, an electronic component being mounted on the substrate, wherein
the housing includes an upper case, a bottom case, and an intermediate frame positioned between the upper case and the bottom case,
the substrate includes an upper substrate above the intermediate frame and a lower substrate below the intermediate frame,
the intermediate frame includes a positioning portion that performs positioning in an up-down direction with respect to the upper substrate and the lower substrate,
the upper case, the upper substrate, the intermediate frame, the lower substrate, and the bottom case are integrally connected by a collective fastener,
the positioning portion performs positioning in a lateral direction with respect to the upper substrate and the lower substrate,
the positioning portion includes a plurality of boss portions provided to extend in the up-down direction from the intermediate frame,
an upper end of the boss portion has an upper fitting that fits with the upper substrate, a lower end of the boss portion has a lower fitting that fits with the lower substrate, the upper fitting is fitted to the upper case across the upper substrate, and the lower fitting is fitted to the bottom case across the lower substrate, the electronic device further comprising:

an upper connector provided on an upper surface of the upper substrate for external connection; and an upper shield portion provided on the upper case to cover the upper connector so as to shield noise.

6. The electronic device according to claim 1, further comprising a mounting seat provided on a side portion of the intermediate frame to fix the upper substrate or the lower substrate.

7. An electronic device comprising:

a housing; and a substrate disposed in the housing, an electronic component being mounted on the substrate, wherein the housing includes an upper case, a bottom case, and an intermediate frame positioned between the upper case and the bottom case, the substrate includes an upper substrate above the intermediate frame and a lower substrate below the intermediate frame, the intermediate frame includes a positioning portion that performs positioning in an up-down direction with respect to the upper substrate and the lower substrate, the upper case, the upper substrate, the intermediate frame, the lower substrate, and the bottom case are integrally connected by a collective fastener, the positioning portion performs positioning in a lateral direction with respect to the upper substrate and the lower substrate, the positioning portion includes a plurality of boss portions provided to extend in the up-down direction from the intermediate frame, an upper end of the boss portion has an upper fitting that fits with the upper substrate, a lower end of the boss portion has a lower fitting that fits with the lower substrate, the upper fitting is fitted to the upper case across the upper substrate, the lower fitting is fitted to the bottom case across the lower substrate, and the upper substrate and the lower substrate are configured by a rigid flexible substrate in which the upper substrate and the lower substrate are integrally connected to each other, and are assembled in a state where the intermediate frame is supported between the upper substrate and the lower substrate.

8. The electronic device according to claim 7, wherein the rigid flexible substrate has a joint substrate positioned at a side portion of the intermediate frame, and a fixing structure is provided between the joint substrate and the intermediate frame.

9. An electronic device comprising:

a housing; and a substrate disposed in the housing, an electronic component being mounted on the substrate, wherein the housing includes an upper case, a bottom case, and an intermediate frame positioned between the upper case and the bottom case, the substrate includes an upper substrate provided above the intermediate frame and a lower substrate provided below the intermediate frame, the intermediate frame includes a positioning portion that performs positioning in an up-down direction with respect to the upper substrate and the lower substrate, the upper case, the upper substrate, and the intermediate frame are integrally connected by a first fastener, the intermediate frame, the lower substrate, and the bottom case are integrally connected by a second fastener, the positioning portion performs positioning in a lateral direction with respect to the upper substrate and the lower substrate, the positioning portion includes a plurality of boss portions provided to extend in the up-down direction from the intermediate frame, an upper end of the boss portion has an upper fitting that fits with the upper substrate, a lower end of the boss portion has a lower fitting that fits with the lower substrate, the upper fitting is fitted to the upper case across the upper substrate, the lower fitting is fitted to the bottom case across the lower substrate, and the first fastener is mounted from an upper side of the upper case, and the second fastener is mounted from a lower side of the bottom case.

10. The electronic device according to claim 1, wherein the upper fitting is in fitted contact to the upper case across the upper substrate, and the lower fitting is in fitted contact to the bottom case across the lower substrate.

11. The electronic device according to claim 4, wherein the upper fitting is in fitted contact to the upper case across the upper substrate, and the lower fitting is in fitted contact to the bottom case across the lower substrate.

12. The electronic device according to claim 5, wherein the upper fitting is in fitted contact to the upper case across the upper substrate, and the lower fitting is in fitted contact to the bottom case across the lower substrate.

13. The electronic device according to claim 7, wherein the upper fitting is in fitted contact to the upper case across the upper substrate, and the lower fitting is in fitted contact to the bottom case across the lower substrate.

14. The electronic device according to claim 9, wherein the upper fitting is in fitted contact to the upper case across the upper substrate, and the lower fitting is in fitted contact to the bottom case across the lower substrate.

* * * * *